United States Patent
Kobayashi et al.

(10) Patent No.: US 11,380,790 B2
(45) Date of Patent: Jul. 5, 2022

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Yusuke Kobayashi, Chiba (JP); Hiro Gangi, Tokyo (JP); Tomoaki Inokuchi, Kanagawa (JP); Ryohei Gejo, Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 34 days.

(21) Appl. No.: 17/015,406

(22) Filed: Sep. 9, 2020

(65) Prior Publication Data
US 2021/0242341 A1 Aug. 5, 2021

(30) Foreign Application Priority Data
Feb. 5, 2020 (JP) .............................. JP2020-018037

(51) Int. Cl.
*H01L 29/78* (2006.01)
*H01L 29/10* (2006.01)
(Continued)

(52) U.S. Cl.
CPC ...... *H01L 29/7813* (2013.01); *H01L 29/1095* (2013.01); *H01L 29/405* (2013.01);
(Continued)

(58) Field of Classification Search
CPC ... H01L 29/405; H01L 29/407; H01L 29/402; H01L 29/404; H01L 29/7813; H01L 29/66734; H01L 29/4236; H01L 29/1095
See application file for complete search history.

(56) References Cited

U.S. PATENT DOCUMENTS 5,086,332 A 2/1992 Nakagawa et al.
7,459,749 B2 12/2008 Yoshimochi
(Continued)

FOREIGN PATENT DOCUMENTS

JP 2547729 B2 10/1996
JP 2585331 B2 2/1997
(Continued)

OTHER PUBLICATIONS

Baba et al., "A Study on a High Blocking Voltage UMOS-FET with a Double Gate Structure," Proc. of 1992 International Symposium on Power Semiconductor Devices & ICs, Tokyo, pp. 300-302.

*Primary Examiner* — Joseph C. Nicely
(74) *Attorney, Agent, or Firm* — Finnegan, Henderson, Farabow, Garrett & Dunner L.L.P.

(57) ABSTRACT

According to one embodiment, a semiconductor device includes first, second, and third electrodes, first, second, and third semiconductor regions, a first member, and a first insulating member. A direction from the first electrode toward the second electrode is along a first direction. The first semiconductor region includes first, second, and third partial regions. A second direction from the second partial region toward the first partial region crosses the first direction. The third partial region is between the second partial region and the second semiconductor region in the first direction. The third semiconductor region is provided between the third partial region and the second semiconductor region. The first insulating member includes a first insulating region and a second insulating region. The first insulating region is between the third partial region and the first member. The second insulating region is between the third semiconductor region and the third electrode.

19 Claims, 22 Drawing Sheets

(51) Int. Cl.
 *H01L 29/66* (2006.01)
 *H01L 29/40* (2006.01)
(52) U.S. Cl.
 CPC .......... *H01L 29/407* (2013.01); *H01L 29/408* (2013.01); *H01L 29/66734* (2013.01)

(56) References Cited

U.S. PATENT DOCUMENTS

| | | | |
|---|---|---|---|
| 8,125,025 | B2 | 2/2012 | Yoshimochi |
| 9,525,059 | B1 | 12/2016 | Kobayashi |
| 2017/0110404 | A1* | 4/2017 | Guan .................. H01L 29/1095 |
| 2020/0161433 | A1* | 5/2020 | Leendertz ........... H01L 29/1608 |
| 2021/0119030 | A1* | 4/2021 | Hsieh ...................... H01L 29/87 |
| 2021/0242342 | A1* | 8/2021 | Goda ................ H01L 29/66734 |
| 2021/0273066 | A1* | 9/2021 | Enea ..................... H01L 29/407 |

FOREIGN PATENT DOCUMENTS

| | | |
|---|---|---|
| JP | 4917246 B2 | 4/2012 |
| JP | 5587535 B2 | 9/2014 |
| JP | 2016-54324 A | 4/2016 |
| JP | 6400545 B2 | 10/2018 |

* cited by examiner

SEMICONDUCTOR DEVICE

CROSS-REFERENCE TO RELATED APPLICATIONS

This application is based upon and claims the benefit of priority from Japanese Patent Application No. 2020-018037, filed on Feb. 5, 2020; the entire contents of which are incorporated herein by reference.

FIELD

Embodiments of the invention generally relate to a semiconductor device.

BACKGROUND

For example, it is desirable to improve the characteristics of a semiconductor device such as a transistor or the like.

DETAILED DESCRIPTION

Figure 1:
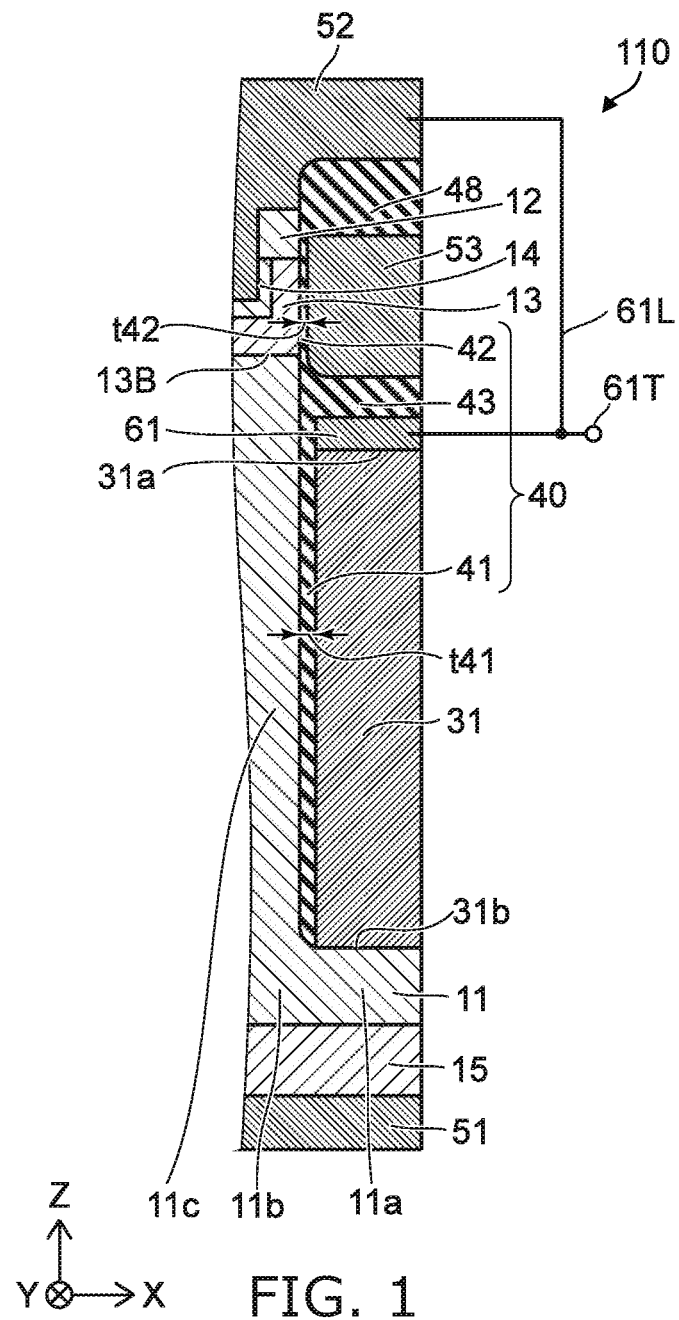
FIG. 1 is a schematic cross-sectional view illustrating a semiconductor device according to a first embodiment.

According to one embodiment, a semiconductor device includes a first electrode, a second electrode, a third electrode, a first semiconductor region, a second semiconductor region, a third semiconductor region, a first member, and a first insulating member. A direction from the first electrode toward the second electrode is along a first direction. The first semiconductor region is of a first conductivity type, and includes a first partial region, a second partial region, and a third partial region. A second direction from the second partial region toward the first partial region crosses the first direction. The second semiconductor region is of the first conductivity type. The third partial region is between the second partial region and the second semiconductor region in the first direction. The third semiconductor region is provided between the third partial region and the second semiconductor region, and is of a second conductivity type. A direction from the third semiconductor region toward the third electrode is along the second direction. A direction from the first partial region toward the first member is along the first direction. A direction from the third partial region toward the first member is along the second direction. The first insulating member includes a first insulating region and a second insulating region. The first insulating region is between the third partial region and the first member in the second direction. The second insulating region is between the third semiconductor region and the third electrode in the second direction. The first member is electrically connected to the first partial region. The first member is electrically connected to the second electrode, or capable of being electrically connected to the second electrode. A resistivity of the first member is greater than a resistivity of the first partial region and less than a resistivity of the first insulating member. According to one embodiment, a semiconductor device includes a first electrode, a second electrode, a third electrode, a first semiconductor region, a second semiconductor region, a third semiconductor region, a first member, and a first insulating member. A direction from the first electrode toward the second electrode is along a first direction. The first semiconductor region is of a first conductivity type, and includes a first partial region, a second partial region, and a third partial region. A second direction from the second partial region toward the first partial region crosses the first direction. The second semiconductor region is of the first conductivity type. The third partial region is between the second partial region and the second semiconductor region in the first direction. The third semiconductor region is provided between the third partial region and the second semiconductor region, and is of a second conductivity type. A direction from the third semiconductor region toward the third electrode is along the second direction. A direction from the first partial region toward the first member is along the first direction. A direction from the third partial region toward the first member is along the second direction. The first insulating member includes a first insulating region and a second insulating region. The first insulating region is between the third partial region and the first member in the second direction. The second insulating region is between the third semiconductor region and the third electrode in the second direction. The first member is electrically connected to the first partial region. The first member is electrically connected to the second electrode, or capable of being electrically connected to the second electrode. The first member includes at least one selected from the group consisting of a first material, a second material, a third material, a fourth material, a fifth material, and a sixth material. The first material includes Si, N, and O. The second material includes a Si—N bond, a N—O bond, and a N—N bond. The third material includes a Si—N bond, a N—H bond, and a N—N bond. The fourth material includes Si, C, and a first element. The first element includes at least one selected from the group consisting of B and N. The fifth material includes Si, O, and a second element. The second element includes at least one selected from the group consisting of Fe, Au, Ni, Ta, W, and Ti. The sixth material includes a third element and a fourth element. The third element includes at least one selected from the group consisting of In, Al, and Ga. The fourth element includes at least one selected from the group consisting of P, As, B, Fe, Au, Ni, Ti, Ta, W, and Ti. According to one embodiment, a semiconductor device includes a first electrode, a second electrode, a first semiconductor region, a second semiconductor region, a first member, and a first insulating member. A direction from the first electrode toward the second electrode is along a first direction. The first semiconductor region is of a first conductivity type, and includes a first partial region, a second partial region, and a third partial region. A second direction from the second partial region toward the first partial region crosses the first direction. The second semiconductor region is of the second conductivity type. The third partial region is between the second partial region and the second semiconductor region in the first direction. A direction from the first partial region toward the first member is along the first direction. A direction from the third partial region toward the first member is along the second direction. The first insulating member includes a first insulating region, and is between the third partial region and the first member in the second direction. The first member is electrically connected to the first partial region. The first member is electrically connected to the second electrode, or capable of being electrically connected to the second electrode. A resistivity of the first member is greater than a resistivity of the first partial region and less than a resistivity of the first insulating member.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first electrode 51, a second electrode 52, a third electrode 53, a first semiconductor region 11, a second semiconductor region 12, a third semiconductor region 13, a first member 31, and a first insulating member 40.

The direction from the first electrode 51 toward the second electrode 52 is along a first direction. The first direction is taken as a Z-axis direction. One direction perpendicular to the Z-axis direction is taken as an X-axis direction. A direction perpendicular to the Z-axis direction and the X-axis direction is taken as a Y-axis direction.

The first semiconductor region 11 includes a first partial region 11a, a second partial region 11b, and a third partial region 11c. A second direction from the second partial region 11b toward the first partial region 11a crosses the first direction (the Z-axis direction). The second direction is, for example, the X-axis direction. The first semiconductor region 11 is of a first conductivity type.

The second semiconductor region 12 is of the first conductivity type. The third partial region 11c of the first semiconductor region 11 is between the second partial region 11b and the second semiconductor region 12 in the first direction (the Z-axis direction).

The third semiconductor region 13 is provided between the third partial region 11c and the second semiconductor region 12 in the Z-axis direction. The third semiconductor region 13 is of a second conductivity type.

For example, the first conductivity type is an n-type, and the second conductivity type is a p-type. The first conductivity type may be the p-type, and the second conductivity type may be the n-type. Hereinbelow, the first conductivity type is taken to be the n-type, and the second conductivity type is taken to be the p-type.

The direction from the third semiconductor region 13 toward the third electrode 53 is along the second direction (e.g., the X-axis direction). For example, a direction from a portion of the second semiconductor region 12 toward a portion of the third electrode 53 may be along the X-axis direction. A direction from a portion of the third partial region 11c toward a portion of the third electrode 53 may be along the X-axis direction.

The direction from the first partial region 11a toward the first member 31 is along the first direction (the Z-axis direction). The direction from the third partial region 11c toward the first member 31 is along the second direction (the X-axis direction).

The first insulating member 40 includes a first insulating region 41 and a second insulating region 42. The first insulating region 41 is between the third partial region 11c and the first member 31 in the second direction (the X-axis direction). The second insulating region 42 is between the third semiconductor region 13 and the third electrode 53 in the second direction.

The first electrode 51 is, for example, a drain electrode. The second electrode 52 is, for example, a source electrode. The third electrode 53 is, for example, a gate electrode. A current that flows between the first electrode 51 and the second electrode 52 can be controlled by controlling the potential of the third electrode 53. The potential of the third electrode 53 is, for example, a potential that is referenced to the potential of the second electrode 52. The semiconductor device 110 is, for example, a transistor. For example, the second insulating region 42 functions as a gate insulating film.

In the example, the semiconductor device 110 includes a fourth semiconductor region 14 and a fifth semiconductor region 15. The fourth semiconductor region 14 is electrically connected to the second electrode 52. The fourth semiconductor region 14 is of the second conductivity type (e.g., the p-type). For example, the concentration of the impurity of the second conductivity type in the fourth semiconductor region 14 is greater than the concentration of the impurity of the second conductivity type in the third semiconductor region 13.

The fifth semiconductor region 15 is provided between the first electrode 51 and the first semiconductor region 11. The fifth semiconductor region 15 is of the first conductivity type (e.g., the n-type). For example, the concentration of the impurity of the first conductivity type in the fifth semiconductor region 15 is greater than the concentration of the impurity of the first conductivity type in the first semiconductor region 11.

For example, the concentration of the impurity of the first conductivity type in the second semiconductor region 12 is greater than the concentration of the impurity of the first conductivity type in the first semiconductor region 11.

The first to fifth semiconductor regions 11 to 15 include, for example, silicon. These semiconductor regions may include a compound semiconductor. The impurity of the first conductivity type (the n-type) includes, for example, at least one selected from the group consisting of As and P when the first to fifth semiconductor regions 11 to 15 include silicon. The impurity of the second conductivity type (the p-type) includes, for example, at least one selected from the group consisting of B and Al.

The concentration of the impurity of the first conductivity type in the first semiconductor region 11 is, for example, not less than $1 \times 10^{16}/cm^3$ and not more than $1 \times 10^{17}/cm^3$. The concentration of the impurity of the first conductivity type in the second semiconductor region 12 is, for example, not less than $1 \times 10^{18}/cm^3$ and not more than $5 \times 10^{19}/cm^3$. The concentration of the impurity of the second conductivity type in the third semiconductor region 13 is, for example, not less than $5 \times 10^{16}/cm^3$ and not more than $1 \times 10^{18}/cm^3$. The concentration of the impurity of the second conductivity type in the fourth semiconductor region 14 is, for example, not less than $1 \times 10^{18}/cm^3$ and not more than $5 \times 10^{19}/cm^3$. The concentration of the impurity of the first conductivity type in the fifth semiconductor region 15 is, for example, not less than $5 \times 10^{18}/cm^3$ and not more than $5 \times 10^{19}/cm^3$.

The first semiconductor region 11 is, for example, an $n^-$-region. The second semiconductor region 12 is, for example, an $n^+$-region. The third semiconductor region 13 is, for example, a $p^-$-region. The fourth semiconductor region 14 is, for example, a $p^+$-region. The fifth semiconductor region 15 is, for example, an $n^+$-region.

For example, the second electrode 52 contacts the second semiconductor region 12 and the fourth semiconductor region 14.

In the example, at least a portion of the first member 31 is between the first partial region 11a and at least a portion of the third electrode 53 in the first direction (the Z-axis direction). The first insulating member 40 includes a third insulating region 43. The third insulating region 43 is between the first member 31 and the third electrode 53 in the Z-axis direction. The third insulating region 43 electrically insulates the first member 31 and the third electrode 53.

In the example, the semiconductor device 110 further includes a second insulating member 48. The second insulating member 48 electrically insulates between the third electrode 53 and the second electrode 52.

The first insulating member 40 and the second insulating member 48 include, for example, silicon oxide (e.g., $SiO_2$).

The first insulating member 40 and the second insulating member 48 may include, for example, at least one selected from the group consisting of silicon oxide, silicon nitride, silicon oxynitride, aluminum oxide, and hafnium oxide.

The first member 31 is electrically connected to the first partial region 11a. For example, the first member 31 contacts the first partial region 11a.

The first member 31 is electrically connected to the second electrode 52. Or, the first member 31 is capable of being electrically connected to the second electrode 52. In the example of FIG. 1, the semiconductor device 110 includes a first conductive portion 61. The first conductive portion 61 electrically connects the first member 31 and the second electrode 52. An interconnect 61L is provided in the example of FIG. 1. The interconnect 61L passes through a position outside the cross section of FIG. 1 and electrically connects the first member 31 and the second electrode 52. A terminal 61T may be provided as shown in FIG. 1. The terminal 61T is electrically connected to the first conductive portion 61. The terminal 61T may be electrically connected to the second electrode 52 by an interconnect or the like that is not included in the semiconductor device 110.

For example, the resistivity of the first member 31 is greater than the resistivity of the first partial region 11a and less than the resistivity of the first insulating member 40. For example, the resistivity of the first member 31 is greater than the resistivity of the first semiconductor region 11. The resistivity of the first member 31 may be greater than the resistivities of the first to third electrodes 51 to 53. The first member 31 is, for example, a "high resistance film".

According to the embodiment, for example, a micro current can flow in the first member 31 in the off-state. Thereby, for example, the electric field in the third partial region 11c (e.g., a mesa region) can be made uniform. For example, a source-drain charge amount Qoss can be reduced. Thereby, for example, the loss can be suppressed. For example, the power consumption can be reduced. For example, the electric field that is applied to the gate insulating film can be reduced. For example, high reliability is obtained. According to the embodiment, for example, a semiconductor device can be provided in which the characteristics can be improved.

The first member 31 may include various materials such as the following. The first member 31 includes, for example, at least one selected from the group consisting of a first material, a second material, a third material, a fourth material, a fifth material, and a sixth material. The first material includes, for example, Si, N, and O.

The second material includes, for example, Si, N, and O. The second material includes, for example, a Si—N bond, a N—O bond, and a N—N bond. The second material includes, for example, oxygen-doped SIPOS (Semi-insulating Poly-crystalline Silicon). The second material is, for example, a mixed material of $SiH_4$, $N_2O$, and $N_2$.

The third material includes Si, N, and O. The third material includes, for example, a Si—N bond, a N—H bond, and a N—N bond. The third material is, for example, nitrogen-doped SIPOS. The third material is a mixed material of $SiH_4$, $NH_3$, and $N_2$.

The fourth material includes, for example, Si, C, and a first element. The first element includes at least one selected from the group consisting of B and N. The fifth material includes, for example, Si, O, and a second element. The second element includes at least one selected from the group consisting of Fe, Au, Ni, Ta, W, and Ti. The sixth material includes, for example, a third element and a fourth element. The third element includes at least one selected from the group consisting of In, Al, and Ga. The fourth element includes at least one selected from the group consisting of P, As, B, Fe, Au, Ni, Ti, Ta, W, and Ti.

For example, the first member 31 can be provided with the appropriate resistivity by such materials. Thereby, as described above, a semiconductor device can be provided in which the characteristics can be improved.

In one example, the resistivity of the first member 31 is not less than $5\times10^7$ Ωcm and not more than $8\times10^{11}$ Ωcm.

For example, the configuration of the semiconductor device 110 illustrated in FIG. 1 may be provided at the end (a peripheral region) of the semiconductor device. Or, for example, the configuration of the semiconductor device 110 illustrated in FIG. 1 may be provided in an inner portion of the semiconductor device.

Figure 2:
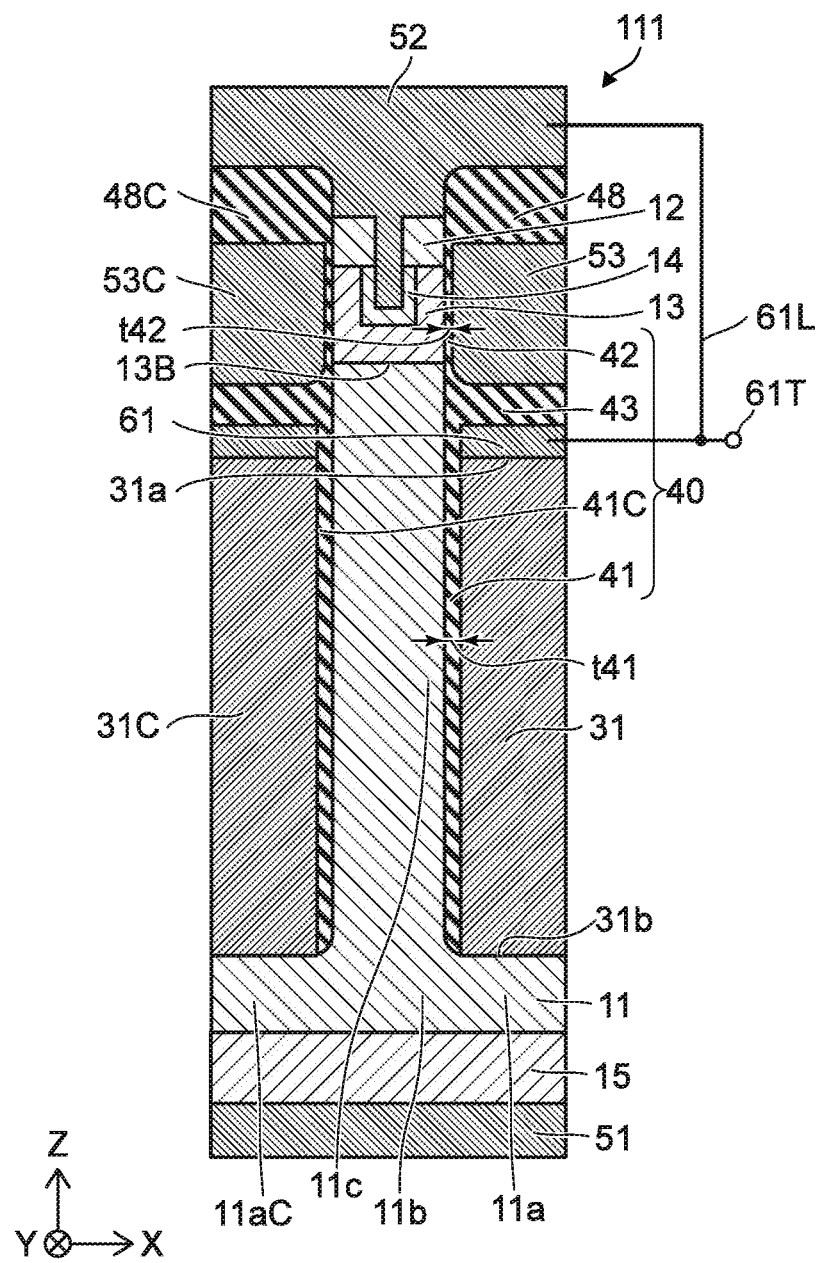
FIG. 2 is a schematic cross-sectional view illustrating a semiconductor device according to the first embodiment.

FIG. 2 is a schematic cross-sectional view illustrating a semiconductor device according to the first embodiment.

As shown in FIG. 2, the semiconductor device 111 according to the embodiment includes a first counter member 31C in addition to the first electrode 51, the second electrode 52, the third electrode 53, the first semiconductor region 11, the second semiconductor region 12, the third semiconductor region 13, the first member 31, and the first insulating member 40. Other than the portions of the semiconductor device 111 described below, the semiconductor device 111 may have a configuration similar to that of the semiconductor device 110.

As shown in FIG. 2, the third partial region 11c is between the first counter member 31C and the first member 31 in the second direction (the X-axis direction).

The first insulating member 40 further includes a first counter insulating region 41C. The first counter insulating region 41C is between the first counter member 31C and the third partial region 11c in the second direction (the X-axis direction). The first semiconductor region 11 further includes a first counter partial region 11aC. The second partial region 11b is between the first counter partial region 11aC and the first partial region 11a in the second direction. The direction from the first counter partial region 11aC toward the first counter member 31C is along the first direction (the Z-axis direction).

The first counter member 31C is electrically connected to the first counter partial region 11aC. For example, the first counter member 31C contacts the first counter partial region 11aC.

For example, the resistivity of the first counter member 31C is greater than the resistivity of the first partial region 11a and less than the resistivity of the first insulating member 40. For example, the resistivity of the first counter member 31C is greater than the resistivity of the first counter partial region 11aC. For example, the first counter member 31C includes at least one selected from the group consisting of the first material, the second material, the third material, the fourth material, the fifth material, and the sixth material described above.

For example, the third partial region 11c is interposed between the first member 31 and the first counter member 31C with the first insulating region 41 and the first counter insulating region 41C interposed.

In the semiconductor device 111, for example, a micro current can flow in the first member 31 and the first counter member 31C in the off-state. Thereby, for example, the electric field in the third partial region 11c (e.g., the mesa region) can be made uniform. For example, the source-drain charge amount Qoss can be reduced. For example, the loss can be suppressed thereby. For example, the power consumption can be reduced. For example, the electric field that is applied to the gate insulating film can be reduced. For example, high reliability is obtained. According to the embodiment, for example, a semiconductor device can be provided in which the characteristics can be improved.

As shown in FIG. 2, the semiconductor device 111 may further include a third counter electrode 53C. In the example, the third counter electrode 53C is provided between the first counter member 31C and the second electrode 52. For example, the third counter electrode 53C functions as a gate electrode. In the example, a second counter insulating member 48C is provided between the third counter electrode 53C and the second electrode 52.

Multiple structures (structures that include the first member 31 and the third electrode 53) illustrated in FIG. 2 may be provided. For example, such multiple structures are arranged along the X-axis direction.

For example, the first member 31 and the first counter member 31C have band configurations extending in the Y-axis direction. For example, the third electrode 53 and the third counter electrode 53C have band configurations extending in the Y-axis direction. For example, the Y-axis direction crosses a plane including the first and second directions.

As shown in FIGS. 1 and 2, the first member 31 includes a first end 31a and a second end 31b. The second end 31b is between the first partial region 11a and the first end 31a in the first direction (the Z-axis direction). The position in the first direction (the Z-axis direction) of the first end 31a is between the position in the first direction of the second end 31b and the position in the first direction of a boundary 13B between the third partial region 11c and the third semiconductor region 13. For example, the first end 31a is the upper end of the first member 31. The boundary 13B is the lower end of the third semiconductor region 13. For example, the upper end of the first member 31 is lower than the lower end of the third semiconductor region 13. The increase of the electric field at the p-n junction portion can be suppressed thereby.

As shown in FIG. 1, the length along the second direction (the X-axis direction) of the first insulating region 41 is taken as a length t41. The length along the second direction (the X-axis direction) of the second insulating region 42 is taken as a length t42. The length t42 is less than the length t41. Appropriate electrical characteristics (e.g., the threshold voltage, etc.) are easily obtained by setting the length t42 (the thickness) of the second insulating region 42, which corresponds to the gate insulating film, to be short.

For example, it is favorable for the length t42 to be not less than 10 nm and not more than 100 nm. For example, it is favorable for the length t41 to be not less than 20 nm and not more than 250 nm. In one example, the length t42 is not less than 45 nm but less than 55 nm, and the length t41 is not less than 90 nm and not more than 110 nm.

Examples of characteristics of the semiconductor device 111 of will now be described. In the following examples, the first counter member 31C has a configuration and characteristics that are similar to those of the first member 31, and the third counter electrode 53C has a configuration and characteristics that are similar to those of the third electrode 53.

Figure 3:
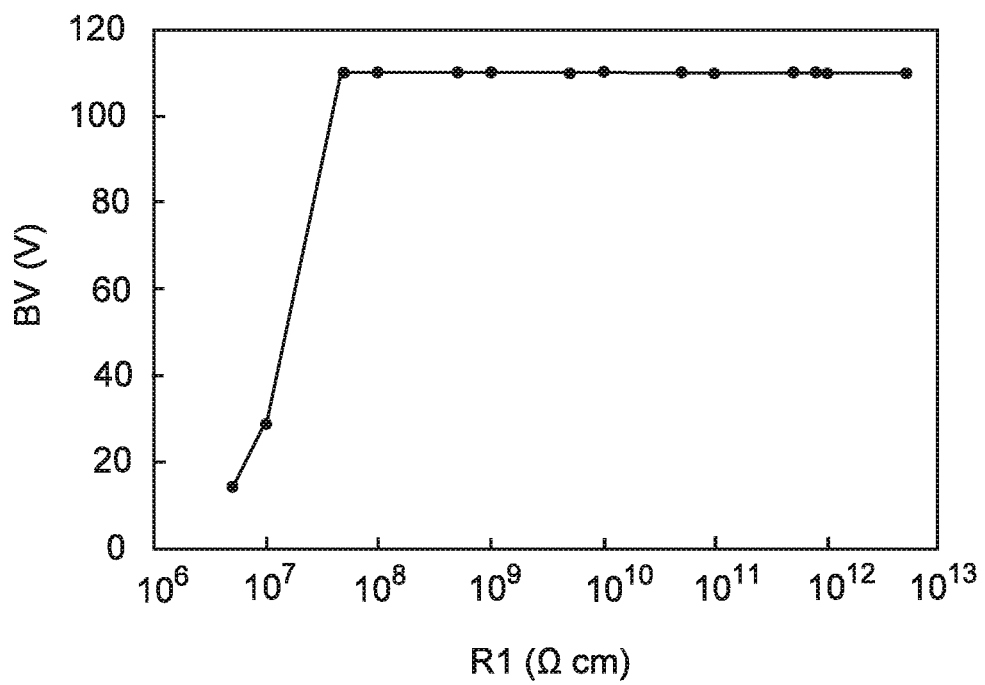
FIG. 3 is a graph illustrating characteristics of the semiconductor device.
Figure 4:
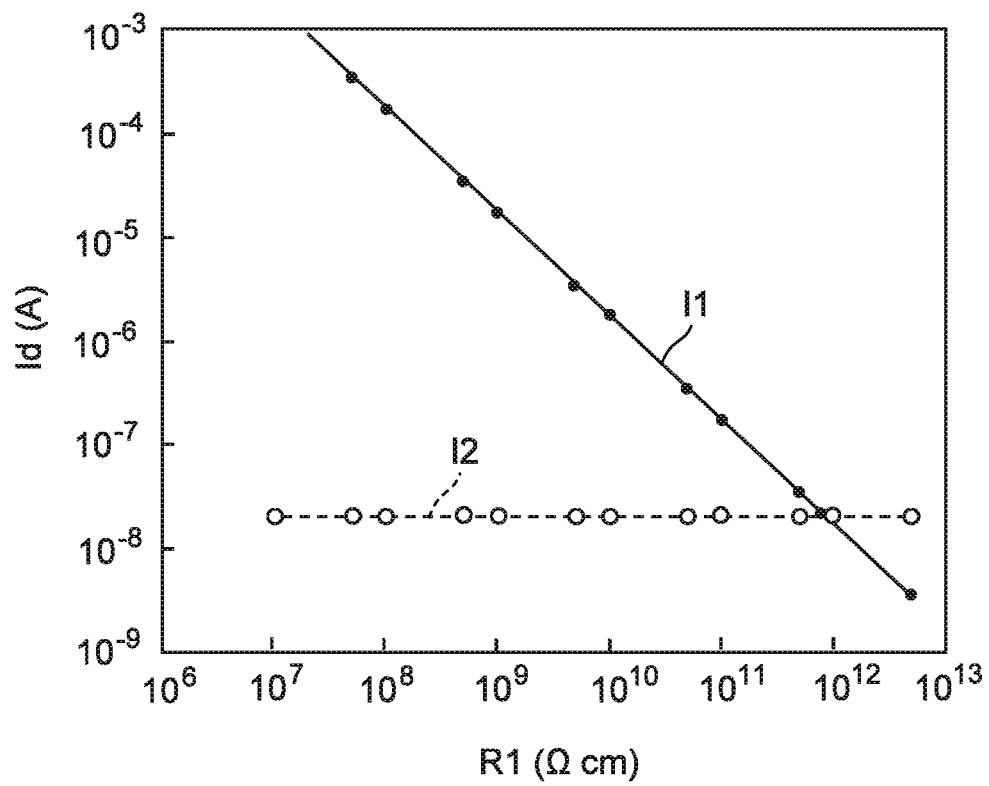
FIG. 4 is a graph illustrating characteristics of the semiconductor device.

FIGS. 3 and 4 are graphs illustrating characteristics of the semiconductor device.

FIG. 3 shows an example of simulation results of the relationship between the blocking voltage and the resistivity of the first member 31. The horizontal axis of FIG. 3 is a resistivity R1 of the first member 31. The vertical axis of FIG. 3 is a blocking voltage BV. As shown in FIG. 3, a high blocking voltage BV is obtained when the resistivity R1 of the first member 31 is $5×10^7$ Ωcm or more.

FIG. 4 shows an example of simulation results of the relationship between the drain current and the resistivity of the first member 31. The horizontal axis of FIG. 4 is the resistivity R1 of the first member 31. The vertical axis of FIG. 4 is a drain current Id. FIG. 4 shows a current component I1 flowing through the first member 31, and a current component I2 flowing through the third partial region 11c. As shown in FIG. 4, the current component I1 increases as the resistivity R1 decreases. For example, the current component I1 is greater than the current component I2 when the resistivity R1 is $8×10^{12}$ Ωcm or less.

In the embodiment, it is favorable for the resistivity of the first member 31 to be, for example, not less than $5×10^7$ Ωcm and not more than $8×10^{11}$ Ωcm. Thereby, for example, a high blocking voltage BV is obtained. The current component I1 can be effectively increased thereby; for example, the electric field in the third partial region 11c can be effectively made uniform. For example, the source-drain charge amount Qoss can be effectively reduced.

Figure 5:
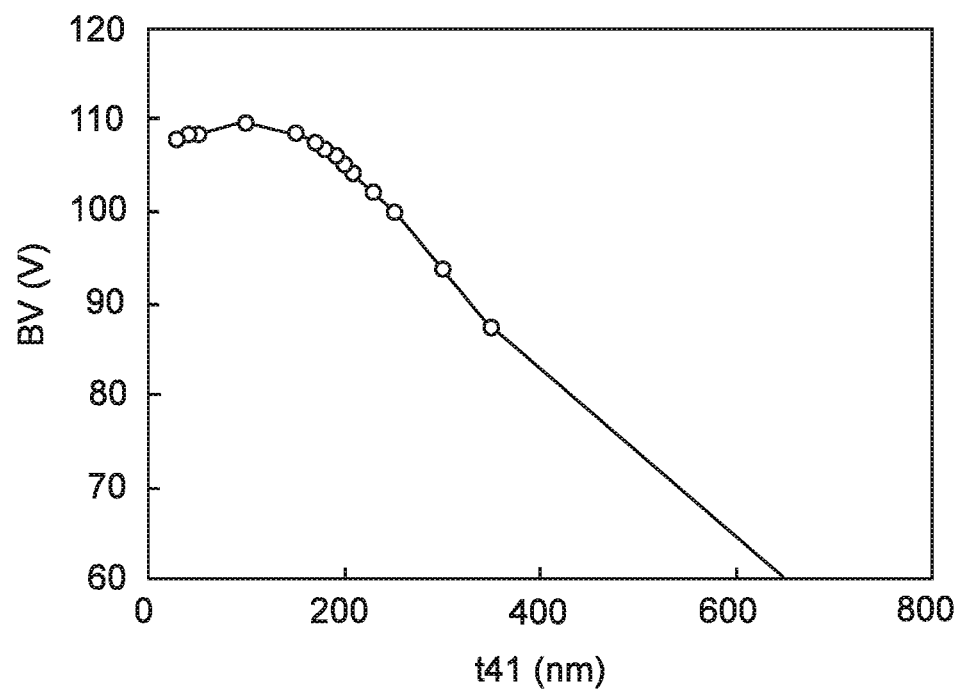
FIG. 5 is a graph illustrating a characteristic of the semiconductor device.

FIG. 5 is a graph illustrating a characteristic of the semiconductor device.

FIG. 5 shows an example of simulation results of the relationship between the blocking voltage and the thickness (the length t41) of the first member 31. The horizontal axis of FIG. 5 is the thickness (the length t41) of the first member 31. The vertical axis of FIG. 5 is the blocking voltage BV. As shown in FIG. 5, the blocking voltage BV increases as the thickness (the length t41) of the first member 31 decreases. For example, a particularly high blocking voltage BV is obtained when the length t41 is not less than 20 nm and not more than 250 nm. In the embodiment, it is favorable for the length t41 to be not less than 20 nm and not more than 250 nm. A high blocking voltage BV is easily obtained thereby. The length t41 may be not less than 20 nm and not more than 200 nm.

Figure 6:
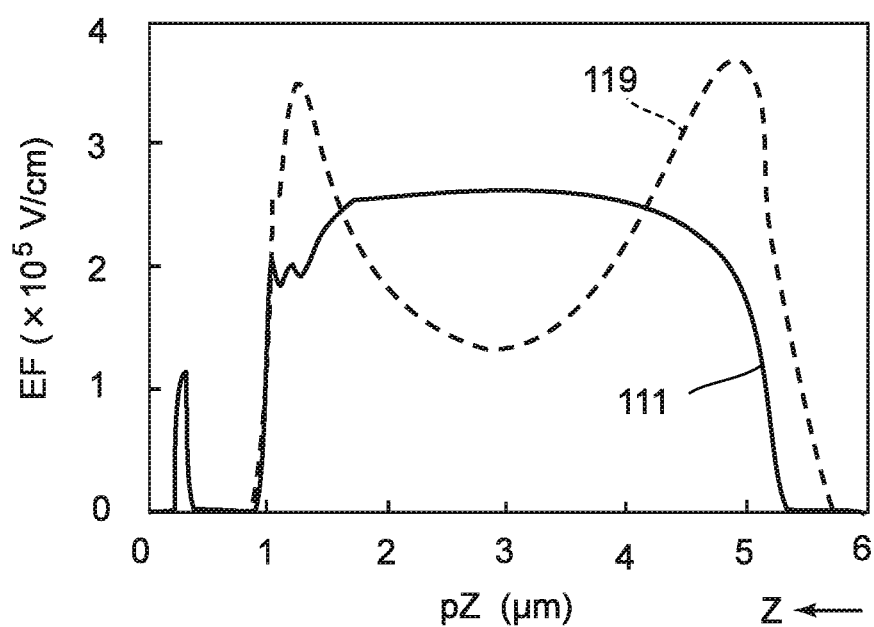
FIG. 6 is a graph illustrating characteristics of semiconductor devices.

FIG. 6 is a graph illustrating characteristics of semiconductor devices.

FIG. 6 illustrates simulation results of the depth-direction distribution of the electric field in the third partial region 11c. FIG. 6 illustrates a characteristic of the semiconductor device 111 including the first member 31, and a characteristic of a semiconductor device 119 of a reference example. In the semiconductor device 119, the resistivity of the first member 31 is $1×10^{10}$ Ωcm, and an insulating film is provided between the first member 31 and the first partial region 11a. The horizontal axis of FIG. 6 is a position pZ in the Z-axis direction (the depth direction). The vertical axis is an electric field EF. In FIG. 6, the region where the position pZ is about 1 μm to about 5 μm corresponds to the depth at which the first member 31 is provided.

As shown in FIG. 6, peaks of the electric field EF occur at the positions of the upper and lower ends of the first member 31 for the semiconductor device 119 of the reference example. Conversely, for the semiconductor device 111, the electric field EF is substantially uniform. Thus, in the embodiment, the electric field EF is easily made uniform.

Figure 7:
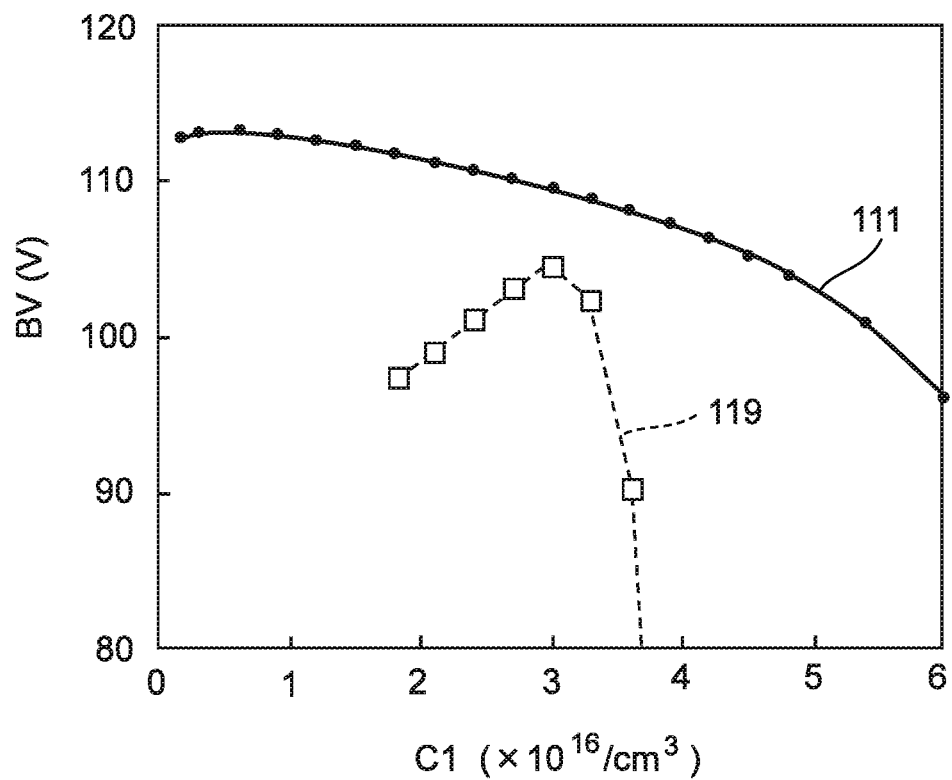
FIG. 7 is a graph illustrating characteristics of the semiconductor devices.

FIG. 7 is a graph illustrating characteristics of the semiconductor devices.

FIG. 7 shows an example of simulation results of the relationship between the blocking voltage and the concentration of the impurity of the first conductivity type (the n-type) in the first semiconductor region 11. The horizontal axis of FIG. 7 is a concentration C1 of the impurity. The vertical axis is the blocking voltage BV. FIG. 7 illustrates the characteristics of the semiconductor device 111 and the semiconductor device 119.

As shown in FIG. 7, the blocking voltage BV abruptly decreases as the concentration C1 of the impurity increases for the semiconductor device 119. For the semiconductor device 111, a high blocking voltage BV can be maintained even when the concentration C1 is high. This is caused by the uniformity of the electric field EF being high in the embodiment.

In the embodiment, for example, the concentration C1 of the impurity can be higher when obtaining the same blocking voltage as the reference example. For the same concentration C1, the blocking voltage BV that is obtained in the embodiment can be greater than that of the reference example.

Figure 8:
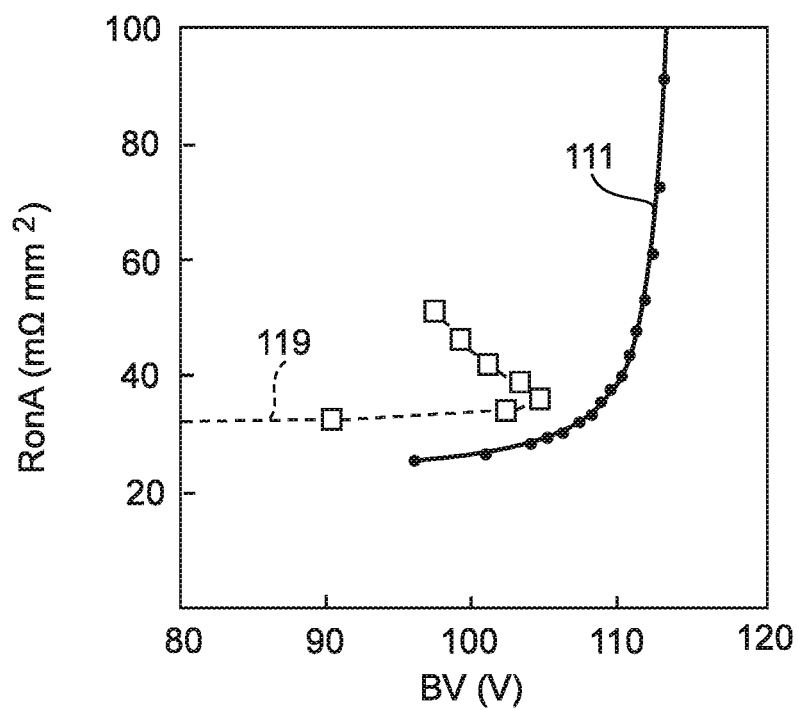
FIG. 8 is a graph illustrating characteristics of the semiconductor devices.
Figure 9:
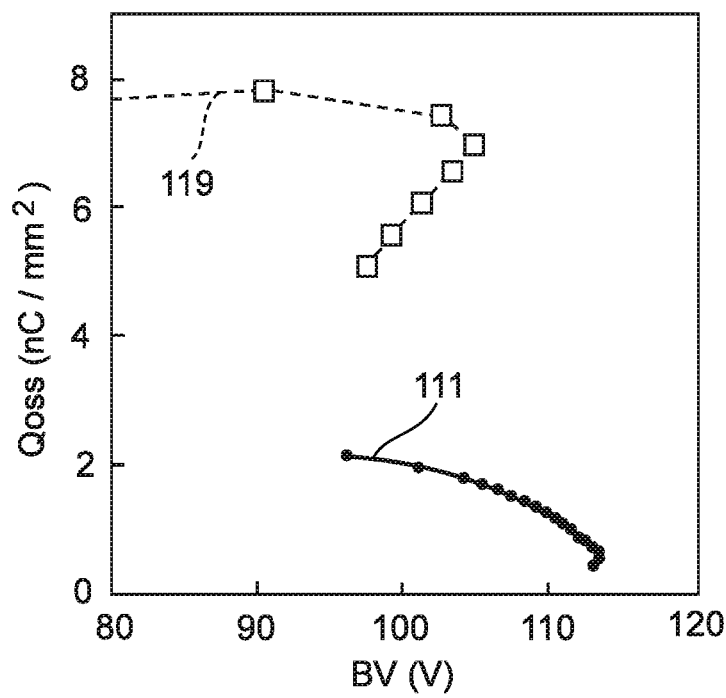
FIG. 9 is a graph illustrating characteristics of the semiconductor devices.
Figure 10:
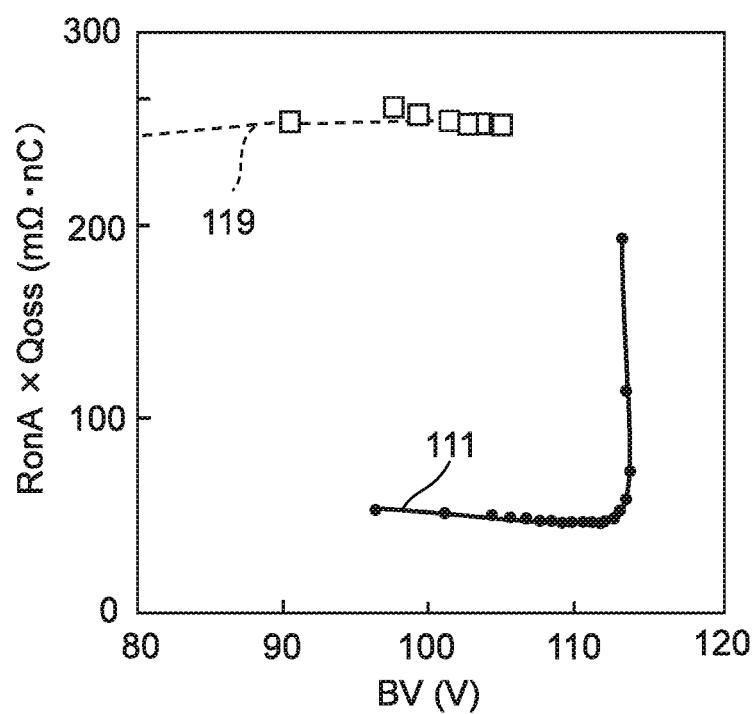
FIG. 10 is a graph illustrating characteristics of the semiconductor devices.

FIGS. 8 to 10 are graphs illustrating characteristics of the semiconductor devices.

These figures show examples of simulation results of characteristics when changing the concentration C1 of the impurity in the first semiconductor region 11. In FIGS. 8 to 10, the horizontal axis is the blocking voltage BV. The vertical axis of FIG. 8 is an on-resistance RonA when the gate voltage is 10 V. The vertical axis of FIG. 9 is the source-drain charge amount Qoss discharged for a drain voltage in the range of 0 V to 50 V. The vertical axis of FIG. 10 is the product of the on-resistance RonA and the charge amount Qoss. These figures show the characteristics of the semiconductor device 111 and the characteristics of the semiconductor device 119 of the reference example.

As shown in FIG. 8, compared to the semiconductor device 119, at least one of a high blocking voltage BV or a low on-resistance RonA is obtained for the semiconductor device 111. As shown in FIG. 9, compared to the semiconductor device 119, at least one of a high blocking voltage BV or a small charge amount Qoss is obtained for the semiconductor device 111. As shown in FIG. 10, compared to the semiconductor device 119, at least one of a high blocking voltage BV or a small product of the on-resistance RonA and the charge amount Qoss is obtained for the semiconductor device 111.

For example, a blocking voltage BV of 104 V will now be focused upon. When referenced to the reference example, the on-resistance RonA can be reduced 23% in the semiconductor device 111. For example, this is because the concentration C1 of the impurity in the first semiconductor region 11 can be high because a uniform electric field EF is obtained in the semiconductor device 111. For example, focusing on the blocking voltage BV of 104 V, when referenced to the reference example, the charge amount Qoss can be reduced 74% in the semiconductor device 111. For example, focusing on the blocking voltage BV of 104 V, when referenced to the reference example, the product of the on-resistance RonA and the charge amount Qoss can be reduced 80% in the semiconductor device 111.

Thus, according to the embodiment, the trade-off between the blocking voltage BV and the on-resistance RonA can be improved. According to the embodiment, the trade-off between the blocking voltage BV and the charge amount Qoss can be improved. According to the embodiment, the trade-off between the blocking voltage BV and the product of the on-resistance RonA and the charge amount Qoss can be improved.

Several examples of semiconductor devices according to the embodiment will now be described. In the following description, portions that are similar to the semiconductor device 110 or the semiconductor device 111 are omitted as appropriate.

FIGS. 11 to 15 are schematic cross-sectional views illustrating semiconductor devices according to the first embodiment.

Figure 11:
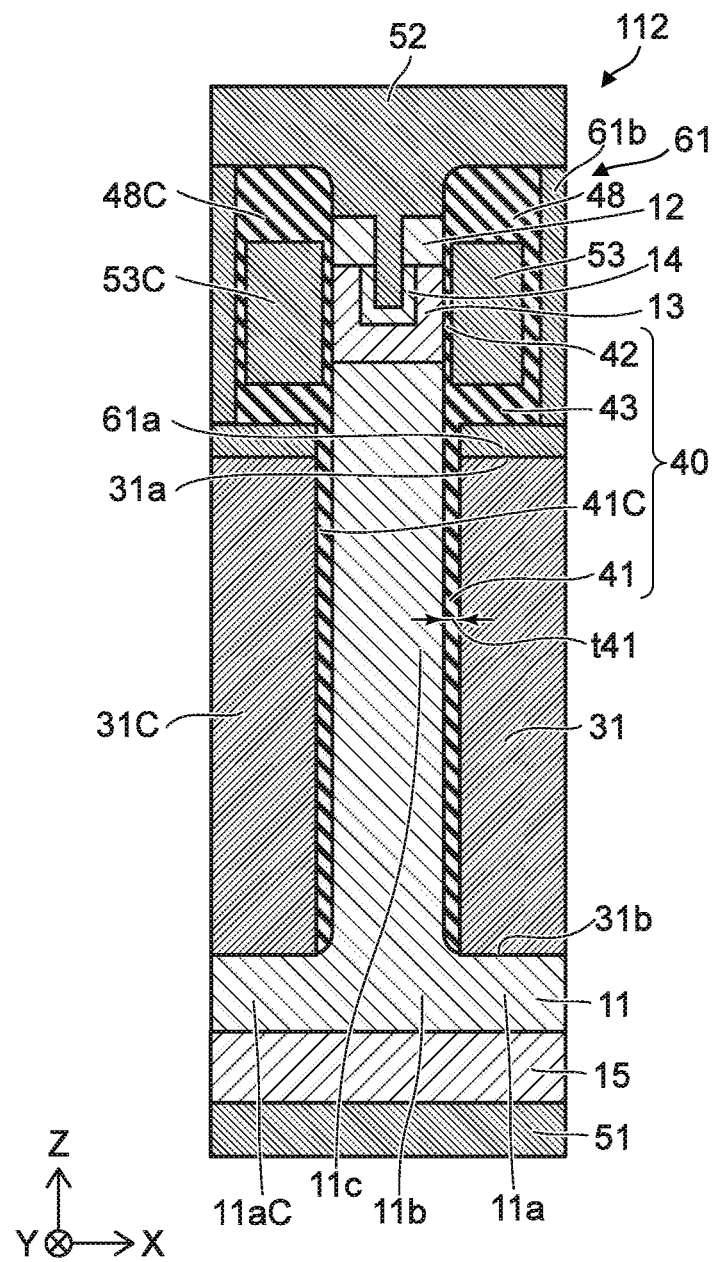
FIG. 11 is a schematic cross-sectional view illustrating a semiconductor device according to the first embodiment.

In a semiconductor device 112 according to the embodiment as shown in FIG. 11, the first conductive portion 61 includes a first conductive region 61a and a second conductive region 61b. For example, the first conductive region 61a contacts the first end 31a. The second conductive region 61b extends in the Z-axis direction. The second conductive region 61b contacts the first conductive region 61a and the second electrode 52. The first member 31 and the second electrode 52 may be electrically connected by such a first conductive portion 61.

Figure 12:
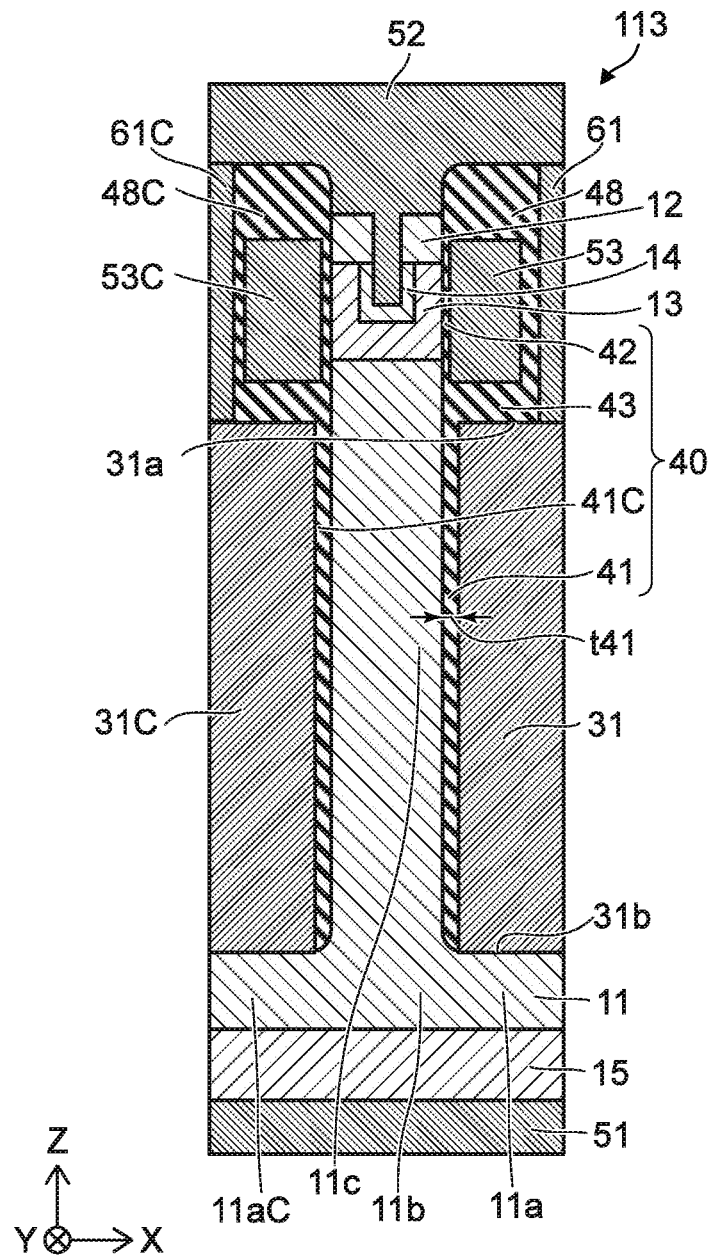
FIG. 12 is a schematic cross-sectional view illustrating a semiconductor device according to the first embodiment.

As in a semiconductor device 113 according to the embodiment shown in FIG. 12, the first conductive portion 61 may extend along the Z-axis direction. For example, the first conductive portion 61 contacts the first member 31 and the second electrode 52. As shown in FIG. 12, the first counter member 31C may be electrically connected to the second electrode 52 by a first counter conductive portion 61C.

Figure 13:
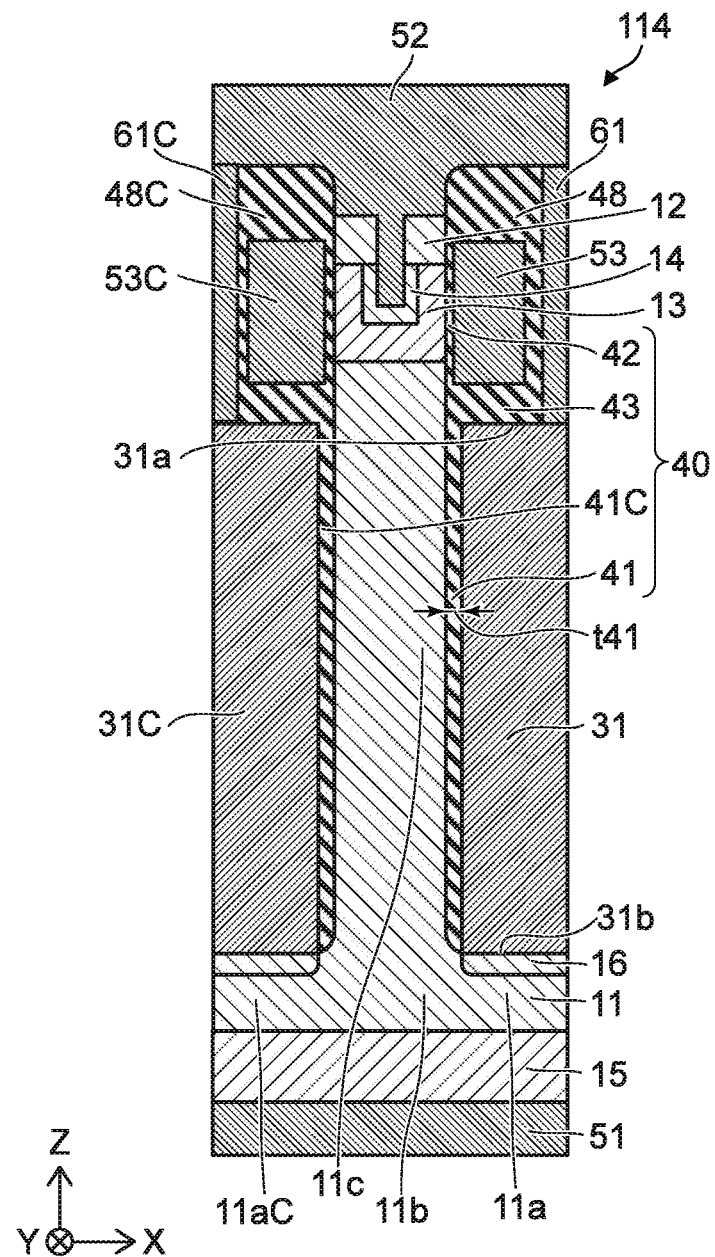
FIG. 13 is a schematic cross-sectional view illustrating a semiconductor device according to the first embodiment.

As shown in FIG. 13, a semiconductor device 114 according to the embodiment includes a sixth semiconductor region 16. The sixth semiconductor region 16 is provided between the first partial region 11a and the first member 31. The sixth semiconductor region 16 is of the first conductivity type. The sixth semiconductor region 16 is electrically connected to the first partial region 11a and the first member 31. The concentration of the impurity of the first conductivity type in the sixth semiconductor region 16 is greater than the concentration of the impurity of the first conductivity type in the first semiconductor region 11. The sixth semiconductor region 16 is, for example, an n$^+$-region. By providing the sixth semiconductor region 16, the first partial region 11a and the first member 31 are electrically connected stably with a low contact resistance.

Figure 14:
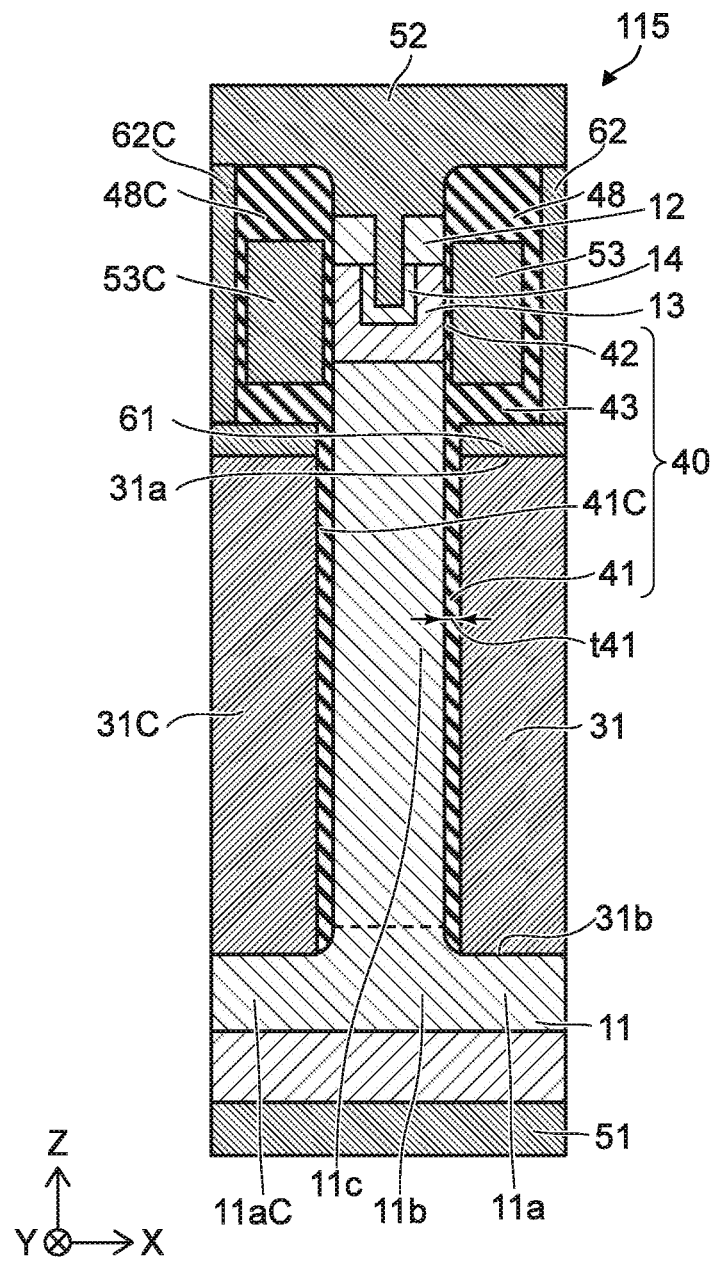
FIG. 14 is a schematic cross-sectional view illustrating a semiconductor device according to the first embodiment.

In a semiconductor device 115 according to the embodiment as shown in FIG. 14, in the first semiconductor region 11, the concentration of the impurity is higher in the first partial region 11a, the second partial region 11b, and the first counter partial region 11aC than in the third partial region 11c (e.g., the n$^-$-region). Thus, the concentration of the impurity of the first conductivity type in the third partial region 11c may be less than the concentration of the impurity of the first conductivity type in the first partial region 11a.

Figure 15:
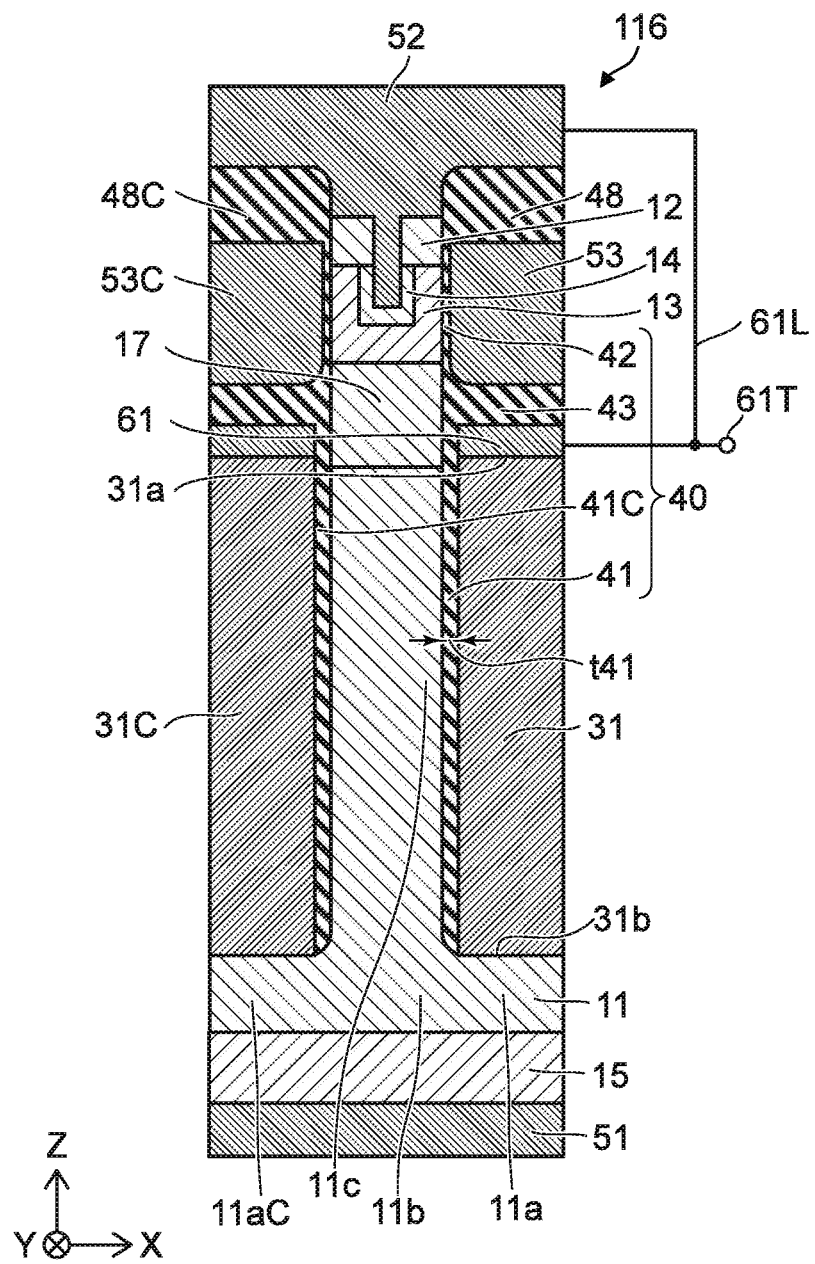
FIG. 15 is a schematic cross-sectional view illustrating a semiconductor device according to the first embodiment.

As shown in FIG. 15, a semiconductor device 116 according to the embodiment includes a seventh semiconductor region 17. The seventh semiconductor region 17 is provided between the third partial region 11c and the third semiconductor region 13. The seventh semiconductor region 17 is of the first conductivity type. The concentration of the impurity of the first conductivity type in the seventh semiconductor region 17 is less than the concentration of the impurity of the first conductivity type in the third partial region 11c. The seventh semiconductor region 17 is, for example, an n$^-$-region. By providing the seventh semiconductor region 17, for example, the blocking voltage BV can be improved when the gate voltage is negative.

In the semiconductor devices 112 to 116 as well, a semiconductor device can be provided in which the characteristics can be improved.

Figure 16:
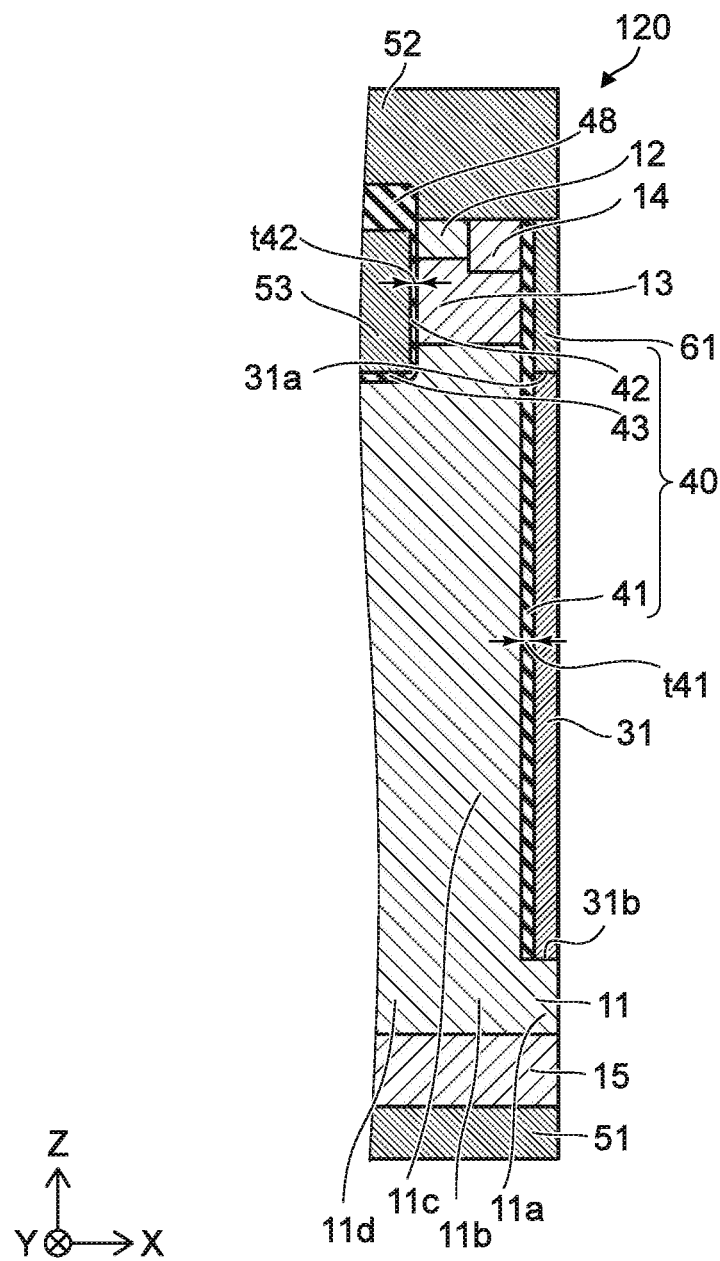
FIG. 16 is a schematic cross-sectional view illustrating a semiconductor device according to the first embodiment.

FIG. 16 is a schematic cross-sectional view illustrating a semiconductor device according to the first embodiment.

In the semiconductor device 120 according to the embodiment as shown in FIG. 16, the first semiconductor region 11 further includes a fourth partial region 11d. The second partial region 11b is between the fourth partial region 11d and the first partial region 11a in the second direction (the X-axis direction). The third electrode 53 is between the fourth partial region 1id and the second electrode 52 in the first direction (the Z-axis direction). The first insulating member 40 includes the third insulating region 43. The third insulating region 43 is between the fourth partial region 11d and the third electrode 53 in the first direction (the Z-axis direction).

Figure 17:
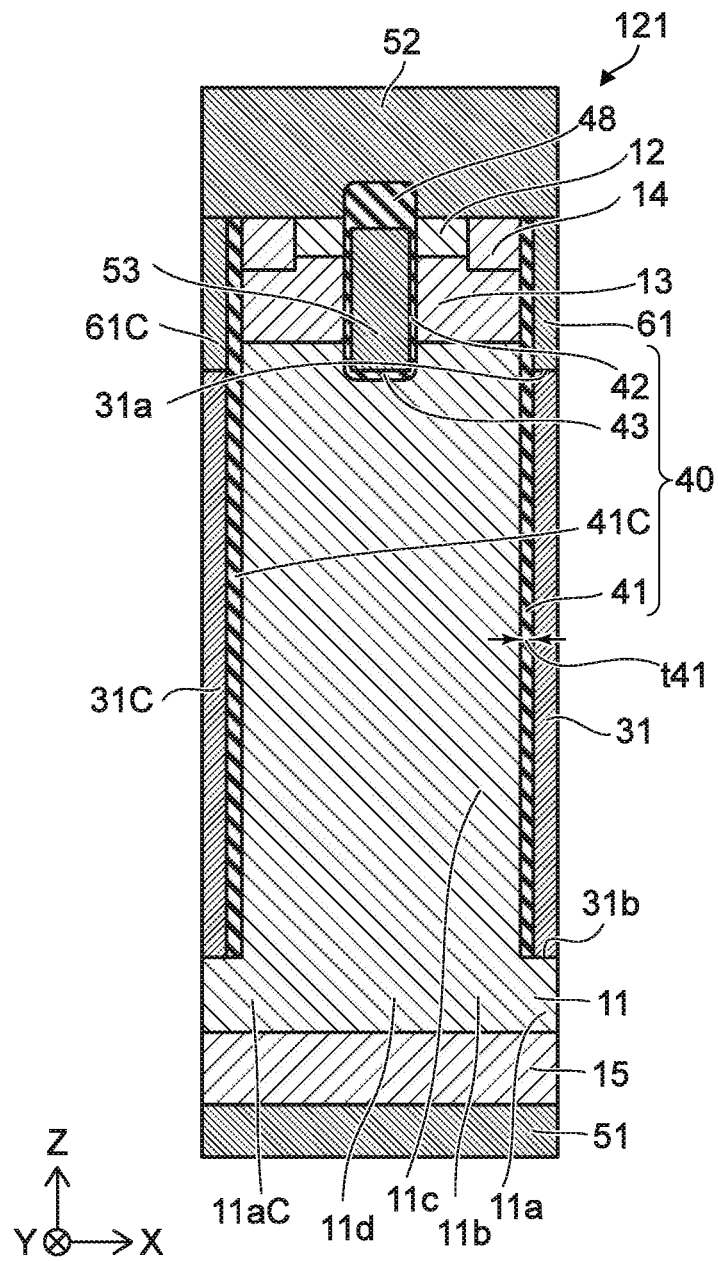
FIG. 17 is a schematic cross-sectional view illustrating a semiconductor device according to the first embodiment.

FIG. 17 is a schematic cross-sectional view illustrating a semiconductor device according to the first embodiment.

In the semiconductor device 121 according to the embodiment as shown in FIG. 17, the first counter member 31C is further provided in the configuration of the semiconductor device 120.

In the semiconductor devices 120 and 121, the third electrode 53 is at a different position from the first member 31 in the X-axis direction. In the semiconductor devices 120 and 121 as well, for example, a micro current can flow in the first member 31 and the first counter member 31C in the off-state. For example, the electric field in the third partial region 11c (e.g., the mesa region) can be made uniform. For example, the source-drain charge amount Qoss can be reduced. Thereby, for example, the loss can be suppressed. For example, the power consumption can be reduced. For example, the electric field that is applied to the gate insulating film can be reduced. For example, high reliability is obtained. In the semiconductor devices 120 and 121 as well, for example, a semiconductor device can be provided in which the characteristics can be improved.

Figure 18:
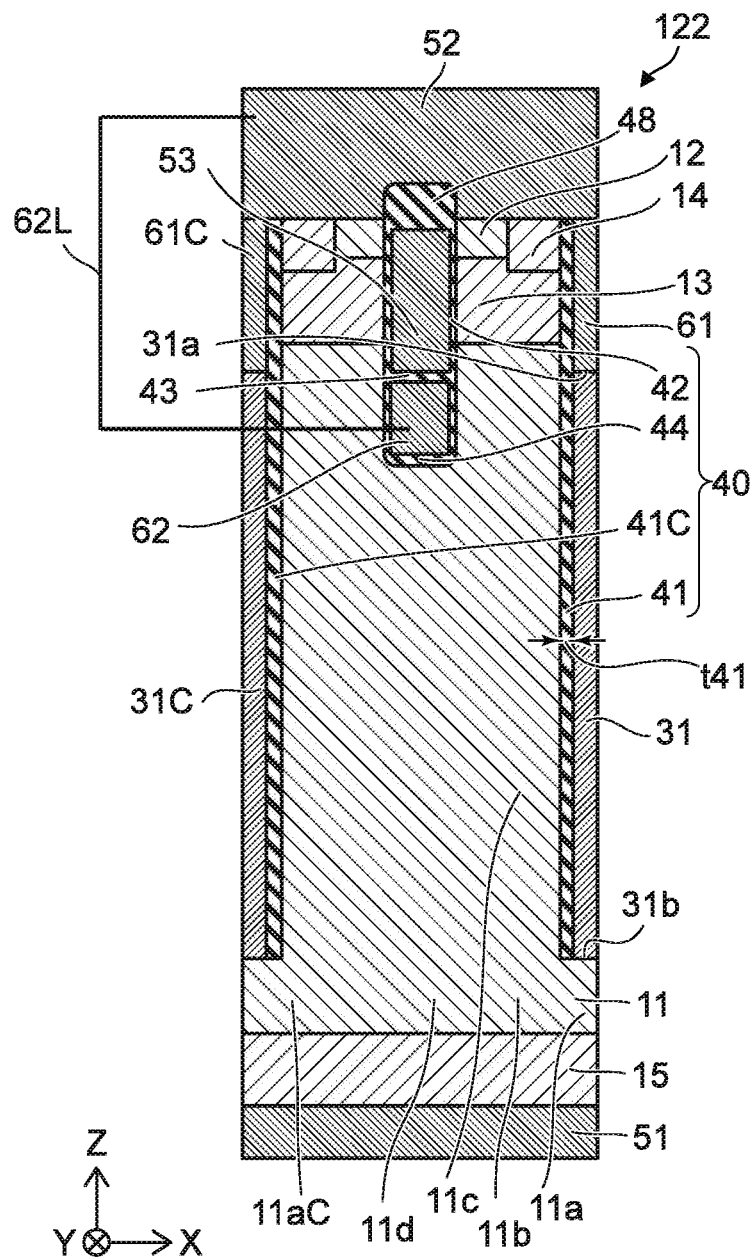
FIG. 18 is a schematic cross-sectional view illustrating a semiconductor device according to the first embodiment.
Figure 19:
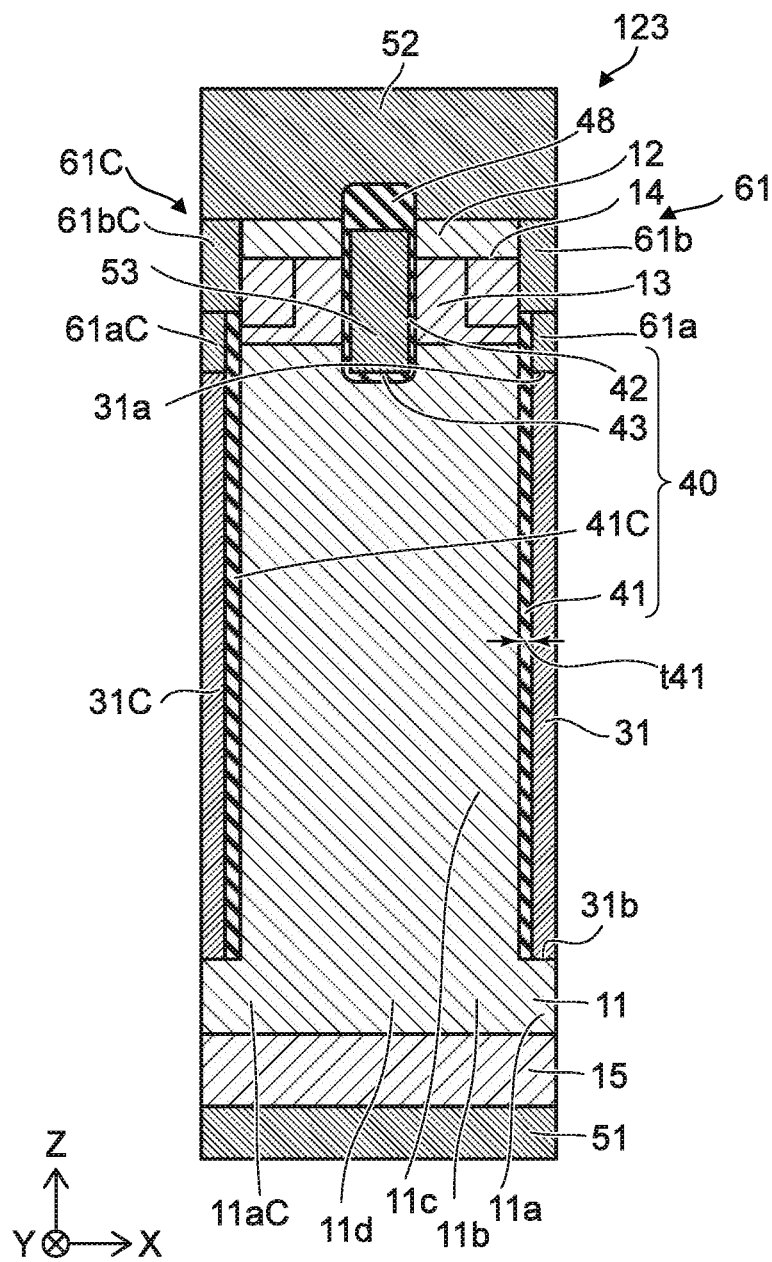
FIG. 19 is a schematic cross-sectional view illustrating a semiconductor device according to the first embodiment.
Figure 20:
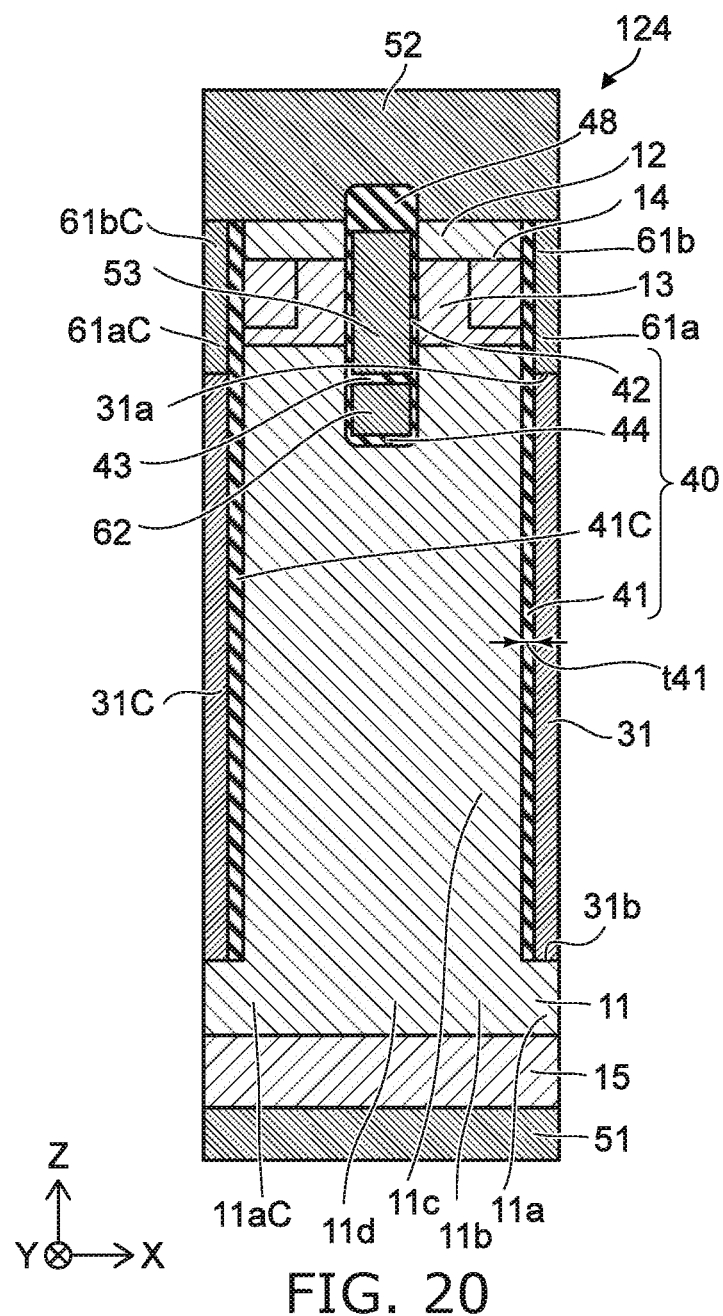
FIG. 20 is a schematic cross-sectional view illustrating a semiconductor device according to the first embodiment.

FIGS. 18 to 20 are schematic cross-sectional views illustrating semiconductor devices according to the first embodiment.

As shown in FIG. 18, a semiconductor device 122 according to the embodiment includes a second conductive portion 62. The second conductive portion 62 is electrically connected to the second electrode 52. As in the example of FIG. 18, for example, the second conductive portion 62 may be electrically connected to the second electrode 52 by an interconnect 62L.

The second conductive portion 62 is between the fourth partial region 1id and the third electrode 53 in the first direction (the Z-axis direction). The first insulating member 40 includes a fourth insulating region 44. The fourth insulating region 44 is between the fourth partial region 1id and the second conductive portion 62 in the first direction (the Z-axis direction). The third insulating region 43 is between the second conductive portion 62 and the third electrode 53 in the first direction. For example, the reverse transfer capacitance can be reduced by the second conductive portion 62.

As in a semiconductor device 123 according to the embodiment shown in FIG. 19, the first conductive portion 61 may include the first conductive region 61a and the second conductive region 61b. The first counter conductive portion 61C may include a first counter conductive region 61aC and a second counter conductive region 61bC.

As in a semiconductor device 124 according to the embodiment shown in FIG. 20, the second conductive portion 62 may be provided in the semiconductor device 123. The interconnect 62L (referring to FIG. 18) may be provided in the semiconductor device 124.

In the semiconductor devices 122 to 124 as well, a semiconductor device can be provided in which the characteristics can be improved.

Second Embodiment

Figure 21:
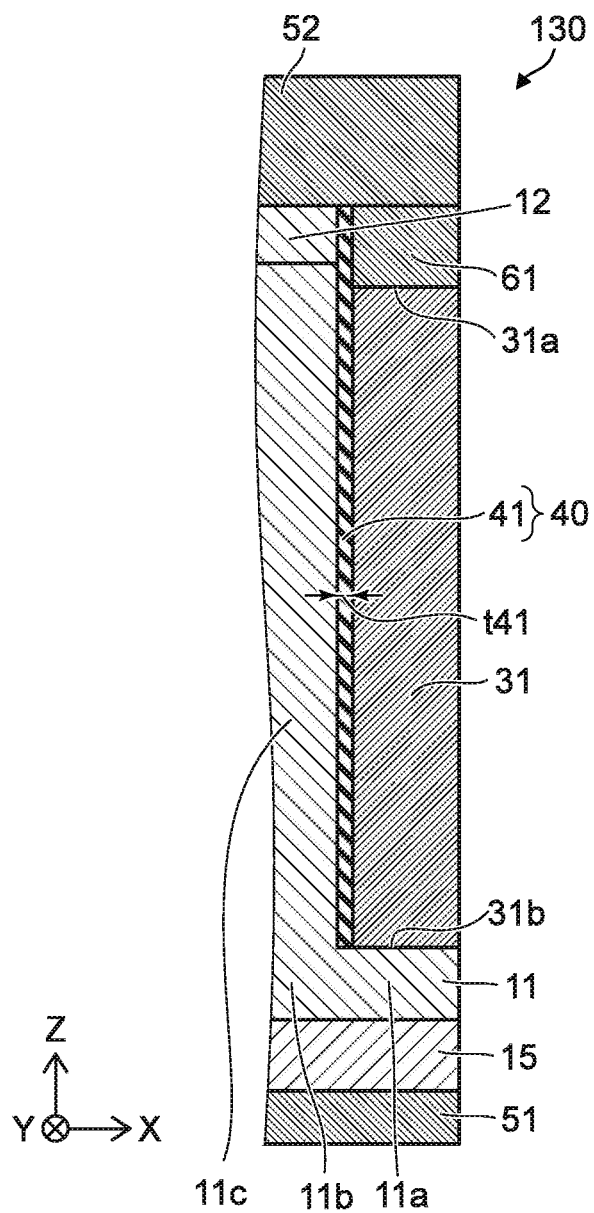
FIG. 21 is a schematic cross-sectional view illustrating a semiconductor device according to a second embodiment.

FIG. 21 is a schematic cross-sectional view illustrating a semiconductor device according to a second embodiment.

As shown in FIG. 21, the semiconductor device 130 according to the embodiment includes the first electrode 51, the second electrode 52, the first semiconductor region 11, the second semiconductor region 12, the first member 31, and the first insulating member 40.

The direction from the first electrode 51 toward the second electrode 52 is along the first direction (e.g., the Z-axis direction). The first semiconductor region 11 includes the first partial region 11a, the second partial region 11b, and the third partial region 11c. The first semiconductor region 11 is of the first conductivity type. The second direction from the second partial region 11b toward the first partial region 11a crosses the first direction. The second direction is, for example, the X-axis direction.

The second semiconductor region 12 is of the second conductivity type. The third partial region 11c is between the second partial region 11b and the second semiconductor region 12 in the first direction (the Z-axis direction).

The direction from the first partial region 11a toward the first member 31 is along the first direction (the Z-axis direction). The direction from the third partial region 11c toward the first member 31 is along the second direction (the X-axis direction). The first insulating member 40 includes the first insulating region 41. The first insulating region 41 is between the third partial region 11c and the first member 31 in the second direction (the X-axis direction). The first member 31 is electrically connected to the first partial region 11a. Or, the first member 31 is capable of being electrically connected to the second electrode 52. For example, at least one of the interconnect 61L or the terminal 61T described in reference to FIGS. 1 and 2 may be provided. Thereby, the first member 31 is capable of being electrically connected to the second electrode 52. The semiconductor device 130 is, for example, a diode.

The resistivity of the first member 31 is, for example, greater than the resistivity of the first partial region 11a and less than the resistivity of the first insulating member 40. For example, the first member 31 may include at least one selected from the group consisting of the first material, the second material, the third material, the fourth material, the fifth material, and the sixth material described above.

By providing such a first member 31, for example, the concentration of the electric field can be suppressed. Thereby, a semiconductor device can be provided in which the characteristics can be improved.

Figure 22:
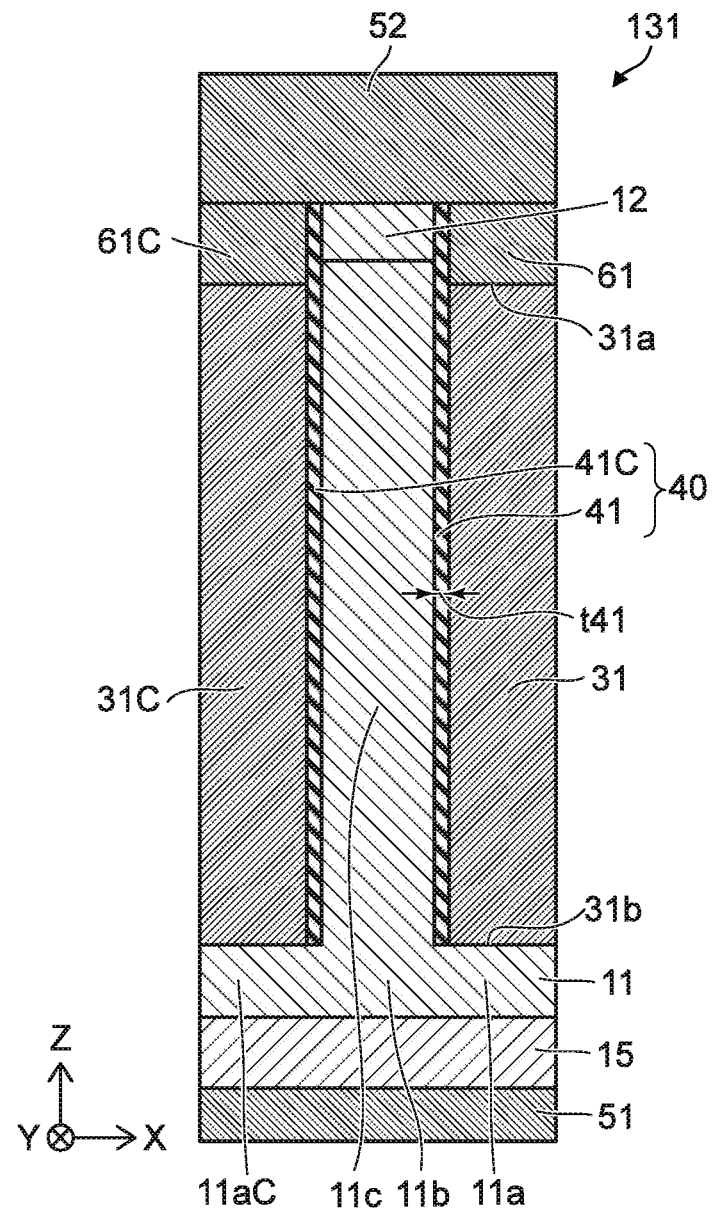
FIG. 22 is a schematic cross-sectional view illustrating a semiconductor device according to the second embodiment.

FIG. 22 is a schematic cross-sectional view illustrating a semiconductor device according to the second embodiment.

As in the semiconductor device 131 according to the embodiment shown in FIG. 22, the first counter member 31C and the first counter conductive portion 61C may be included. The first insulating member 40 may include the first counter insulating region 41C. In the semiconductor device 131 as well, a semiconductor device can be provided in which the characteristics can be improved.

An example of a method for manufacturing a semiconductor device according to the embodiment will now be described. An example of a method for manufacturing the semiconductor device 111 will be described.

FIGS. 23A, 23B, 24A, 24B, 25A, 25B, and 26 are schematic cross-sectional views illustrating the method for manufacturing the semiconductor device according to the embodiment.

Figures 23A, 23B:
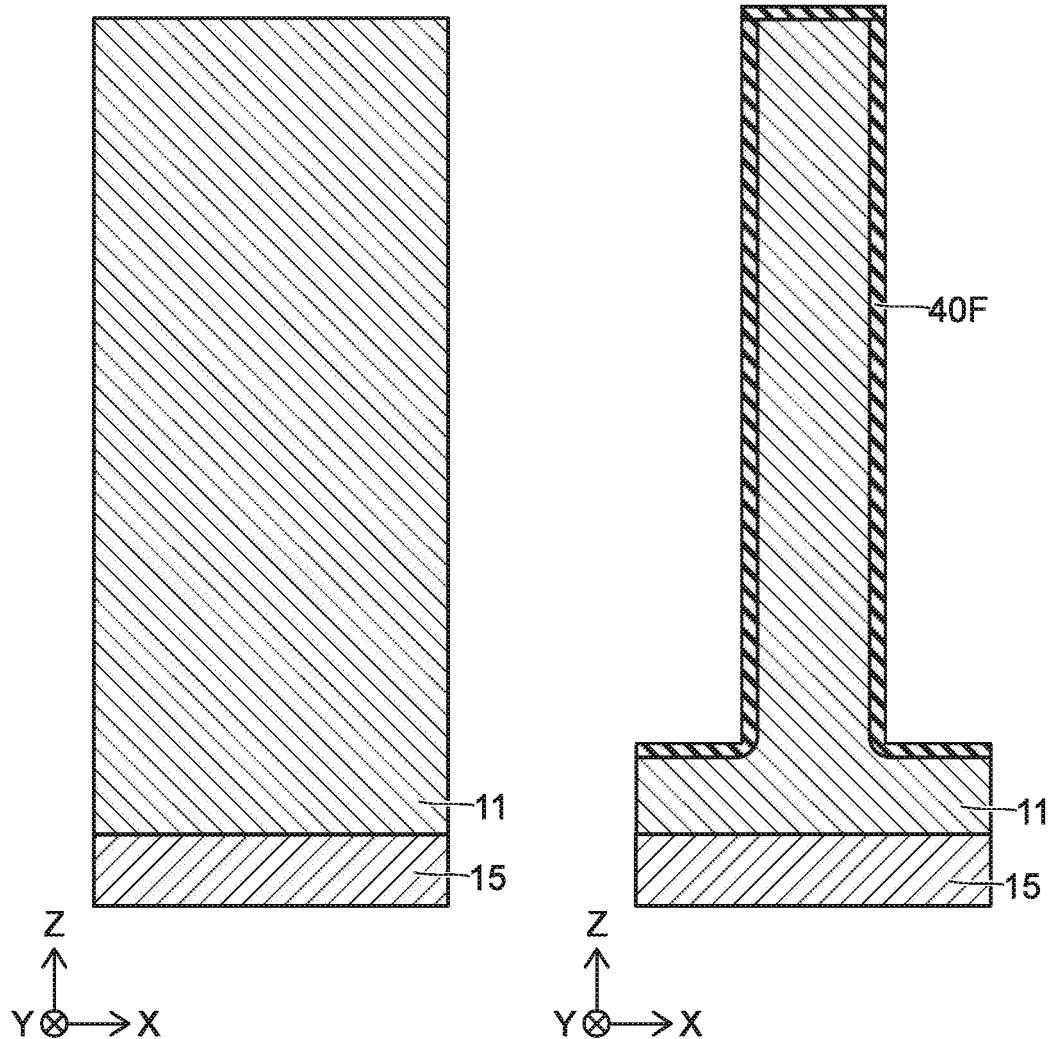
FIGS. 23A and 23B are schematic cross-sectional views illustrating a method for manufacturing the semiconductor device according to the embodiment.

As shown in FIG. 23A, for example, an n-type semiconductor layer that is used to form the first semiconductor region 11 is formed on the fifth semiconductor region 15 (e.g., a semiconductor substrate). The thickness of the n-type semiconductor layer is, for example, 8.75 μm. For example, the n-type semiconductor layer is formed by epitaxial growth.

As shown in FIG. 23B, a trench is formed by removing a portion of the n-type semiconductor layer after forming a silicon oxide film used as a mask; and an insulating film 40F (e.g., a $SiO_2$ film) is formed from the surface portion of the n-type semiconductor layer by thermal oxidation. The insulating film 40F is used to form at least a portion of the first insulating member 40. The thickness of the insulating film 40F is, for example, not less than 20 nm and not more than 250 nm.

Figure 24A:
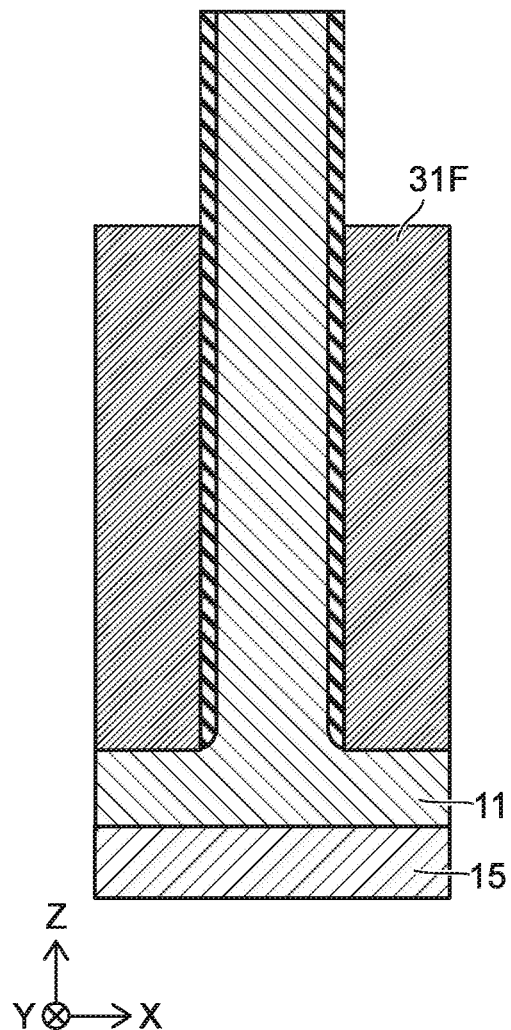
FIGS. 24A and 24B are schematic cross-sectional views illustrating a method for manufacturing the semiconductor device according to the embodiment.

As shown in FIG. 24A, the insulating film 40F that is positioned on the bottom portion of the trench and the top portion of the n-type semiconductor layer is removed by dry etching; subsequently, a film 31F that is used to form the first member 31 is formed. The film 31F may be, for example, polysilicon including an impurity with a low concentration. The film 31F may be, for example, an InP film including Fe. A portion of the film 31F is removed by etching.

Figure 24B:
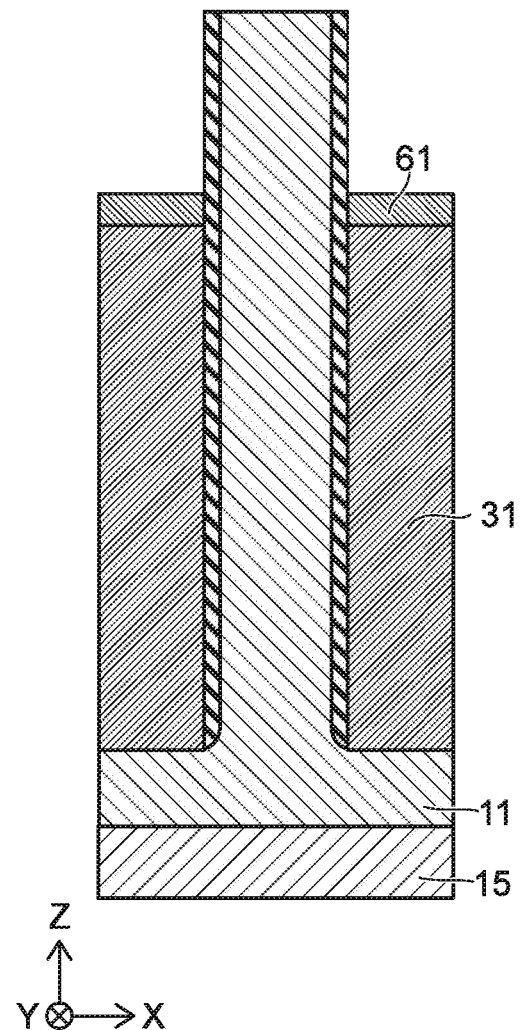

As shown in FIG. 24B, for example, a polysilicon film that includes an impurity with a high concentration is formed as the first conductive portion 61.

Figure 25A:
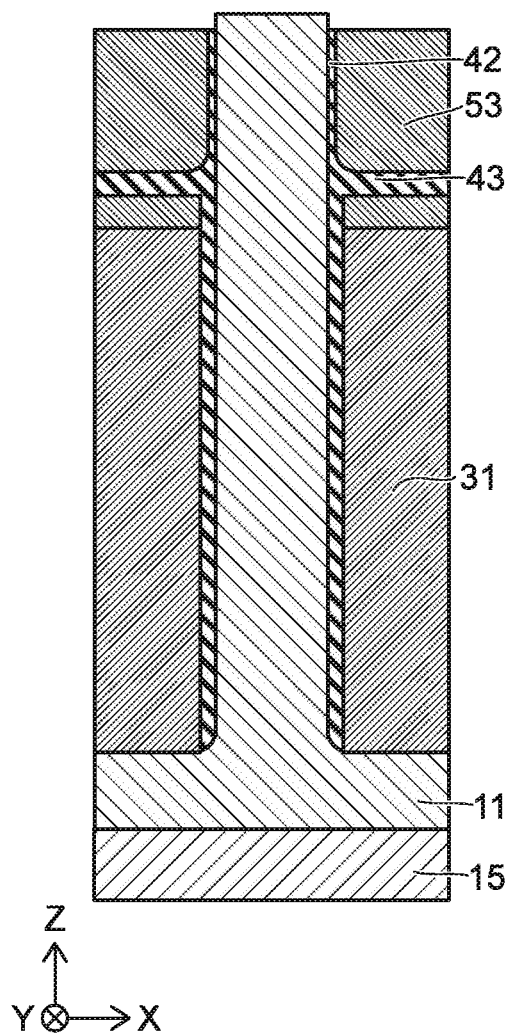
FIGS. 25A and 25B are schematic cross-sectional views illustrating a method for manufacturing the semiconductor device according to the embodiment.

As shown in FIG. 25A, insulating films (e.g., $SiO_2$ films) that are used to form the third insulating region 43 and the second insulating region 42 are formed, and the third electrode 53 is formed. Unnecessary films are removed as necessary.

Figure 25B:
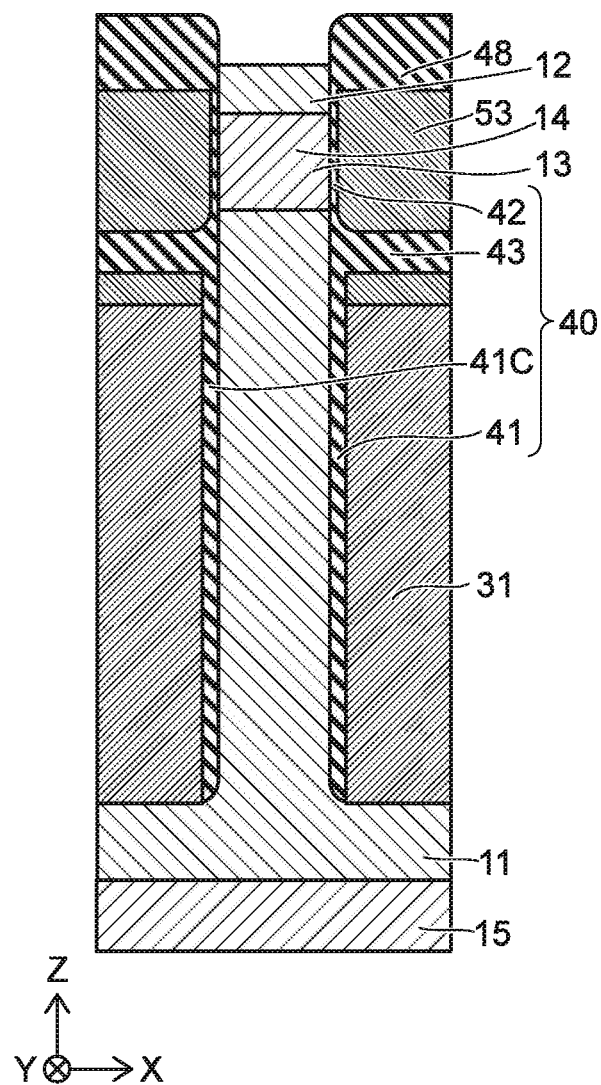

As shown in FIG. 25B, the second insulating member 48 is formed, and the third semiconductor region 13 and the second semiconductor region 12 are formed by introducing a p-type impurity and introducing an n-type impurity.

Figure 26:
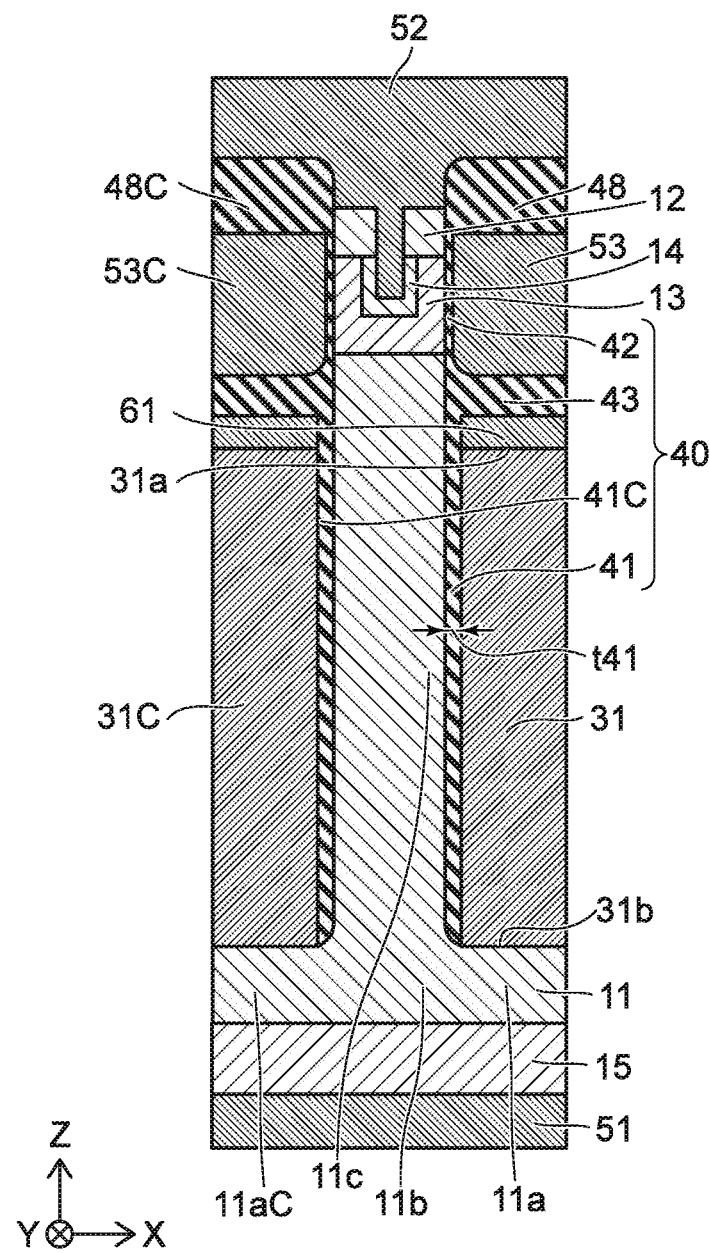
FIG. 26 is a schematic cross-sectional view illustrating a method for manufacturing the semiconductor device according to the embodiment.

The first electrode 51 and the second electrode 52 are formed as shown in FIG. 26. Thereby, for example, the semiconductor device 111 is obtained.

According to the embodiments, a semiconductor device can be provided in which the characteristics can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrodes, semiconductor regions, members, insulating members, conductive portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode, a direction from the first electrode toward the second electrode being along a first direction;
a first semiconductor region of a first conductivity type, the first semiconductor region including a first partial region, a second partial region, and a third partial region, a second direction from the second partial region toward the first partial region crossing the first direction;
a second semiconductor region of the first conductivity type, the third partial region being between the second partial region and the second semiconductor region in the first direction,
a third semiconductor region provided between the third partial region and the second semiconductor region, the third semiconductor region being of a second conductivity type;
a third electrode, a direction from the third semiconductor region toward the third electrode being along the second direction;
a first member, a direction from the first partial region toward the first member being along the first direction, a direction from the third partial region toward the first member being along the second direction; and
a first insulating member including a first insulating region and a second insulating region, the first insulating region being between the third partial region and the first member in the second direction, the second insulating region being between the third semiconductor region and the third electrode in the second direction,
the first member being electrically connected to the first partial region,
the first member being electrically connected to the second electrode, or capable of being electrically connected to the second electrode,
a resistivity of the first member being greater than a resistivity of the first partial region and less than a resistivity of the first insulating member.

2. The device according to claim 1, wherein the resistivity of the first member is not less than $5\times10^7$ $\Omega$cm and not more than $8\times10^{11}$ $\Omega$cm.

3. The device according to claim 1, further comprising:
a first counter member,
the third partial region being between the first counter member and the first member in the second direction,
the first insulating member further including a first counter insulating region, the first counter insulating region being between the first counter member and the third partial region in the second direction,
the first semiconductor region further including a first counter partial region, the second partial region being between the first counter partial region and the first partial region in the second direction,
a direction from the first counter partial region toward the first counter member being along the first direction,
the first counter member being electrically connected to the first counter partial region,
a resistivity of the first counter member being greater than the resistivity of the first partial region and less than the resistivity of the first insulating member.

4. The device according to claim 1, wherein a length along the second direction of the first insulating region is not less than 20 nm and not more than 250 nm.

5. The device according to claim 1, further comprising:
a first conductive portion electrically connecting the first member and the second electrode.

6. The device according to claim 1, further comprising:
a terminal electrically connected to the first member.

7. The device according to claim 1, wherein
the first member includes a first end and a second end,
the second end is between the first partial region and the first end in the first direction, and
a position in the first direction of the first end is between a position in the first direction of the second end and a position in the first direction of a boundary between the third partial region and the third semiconductor region.

8. The device according to claim 1, wherein
at least a portion of the first member is between the first partial region and at least a portion of the third electrode in the first direction,
the first insulating member includes a third insulating region, and
the third insulating region is between the first member and the third electrode.

9. The device according to claim 8, further comprising:
a sixth semiconductor region provided between the first partial region and the first member, the sixth semiconductor region being of the first conductivity type,
the sixth semiconductor region being electrically connected to the first partial region and the first member,
a concentration of an impurity of the first conductivity type in the sixth semiconductor region being greater than a concentration of an impurity of the first conductivity type in the first semiconductor region.

10. The device according to claim 8, wherein
a concentration of an impurity of the first conductivity type in the third partial region is less than a concentration of an impurity of the first conductivity type in the first partial region.

11. The device according to claim 8, further comprising:
a seventh semiconductor region provided between the third partial region and the third semiconductor region, the seventh semiconductor region being of the first conductivity type,
a concentration of an impurity of the first conductivity type in the seventh semiconductor region being less than a concentration of an impurity of the first conductivity type in the third partial region.

12. The device according to claim 1, wherein
the first semiconductor region further includes a fourth partial region,
the second partial region is between the fourth partial region and the first partial region in the second direction, the third electrode is between the fourth partial region and the second electrode in the first direction,
the first insulating member further includes a third insulating region, and
the third insulating region is between the fourth partial region and the third electrode in the first direction.

13. The device according to claim 12, further comprising:
a second conductive portion electrically connected to the second electrode,
the second conductive portion being between the fourth partial region and the third electrode in the first direction,
the first insulating member further including a fourth insulating region,
the fourth insulating region being between the fourth partial region and the second conductive portion in the first direction,
the third insulating region being between the second conductive portion and the third electrode in the first direction.

14. The device according to claim 1, further comprising:
a fourth semiconductor region electrically connected to the second electrode,
the fourth semiconductor region being of the second conductivity type,
a concentration of an impurity of the second conductivity type in the fourth semiconductor region being greater than a concentration of the impurity of the second conductivity type in the third semiconductor region.

15. The device according to claim 1, further comprising:
a fifth semiconductor region provided between the first electrode and the first semiconductor region,
the fifth semiconductor region being of the first conductivity type,
a concentration of an impurity of the first conductivity type in the fifth semiconductor region being greater than a concentration of the impurity of the first conductivity type in the first semiconductor region.

16. The device according to claim 15, wherein
a concentration of an impurity of the first conductivity type in the second semiconductor region is greater than the concentration of the impurity of the first conductivity type in the first semiconductor region.

17. A semiconductor device, comprising:
a first electrode;
a second electrode, a direction from the first electrode toward the second electrode being along a first direction;
a first semiconductor region of a first conductivity type, the first semiconductor region including a first partial region, a second partial region, and a third partial region, a second direction from the second partial region toward the first partial region crossing the first direction;
a second semiconductor region of the first conductivity type, the third partial region being between the second partial region and the second semiconductor region in the first direction;
a third semiconductor region provided between the third partial region and the second semiconductor region, the third semiconductor region being of a second conductivity type;
a third electrode, a direction from the third semiconductor region toward the third electrode being along the second direction;
a first member, a direction from the first partial region toward the first member being along the first direction,
a direction from the third partial region toward the first member being along the second direction; and
a first insulating member including a first insulating region and a second insulating region, the first insulating region being between the third partial region and the first member in the second direction, the second insulating region being between the third semiconductor region and the third electrode in the second direction,
the first member being electrically connected to the first partial region,
the first member being electrically connected to the second electrode, or capable of being electrically connected to the second electrode,
the first member including at least one selected from the group consisting of a first material, a second material, a third material, a fourth material, a fifth material, and a sixth material,
the first material including Si, N, and O,
the second material including a Si—N bond, a N—O bond, and a N—N bond,
the third material including a Si—N bond, a N—H bond, and a N—N bond,
the fourth material including Si, C, and a first element, the first element including at least one selected from the group consisting of B and N,
the fifth material including Si, O, and a second element, the second element including at least one selected from the group consisting of Fe, Au, Ni, Ta, W, and Ti,
the sixth material including a third element and a fourth element, the third element including at least one selected from the group consisting of In, Al, and Ga, the fourth element including at least one selected from the group consisting of P, As, B, Fe, Au, Ni, Ti, Ta, W, and Ti.

18. The device according to claim 17, further comprising:
a first counter member,
the third partial region being between the first counter member and the first member in the second direction,
the first insulating member further including a first counter insulating region, the first counter insulating region being between the first counter member and the third partial region in the second direction,
the first semiconductor region further including a first counter partial region, the second partial region being between the first counter partial region and the first partial region in the second direction,
a direction from the first counter partial region toward the first counter member being along the first direction,
the first counter member being electrically connected to the first counter partial region,
the first counter member including at least one selected from the group consisting of the first material, the second material, the third material, the fourth material, the fifth material, and the sixth material.

19. A semiconductor device, comprising:
a first electrode;
a second electrode, a direction from the first electrode toward the second electrode being along a first direction;
a first semiconductor region of a first conductivity type, the first semiconductor region including a first partial region, a second partial region, and a third partial region, a second direction from the second partial region toward the first partial region crossing the first direction;

a second semiconductor region of the second conductivity type, the third partial region being between the second partial region and the second semiconductor region in the first direction;
a first member, a direction from the first partial region toward the first member being along the first direction, a direction from the third partial region toward the first member being along the second direction; and
a first insulating member including a first insulating region, the first insulating region being between the third partial region and the first member in the second direction,
the first member being electrically connected to the first partial region,
the first member being electrically connected to the second electrode, or capable of being electrically connected to the second electrode,
a resistivity of the first member being greater than a resistivity of the first partial region and less than a resistivity of the first insulating member.

* * * * *